(12) United States Patent
Yokoyama et al.

(10) Patent No.: US 8,435,811 B2
(45) Date of Patent: May 7, 2013

(54) METHOD FOR MANUFACTURING EVAPORATION DONOR SUBSTRATE AND LIGHT-EMITTING DEVICE

(75) Inventors: Kohei Yokoyama, Kanagawa (JP); Takahiro Ibe, Kanagawa (JP); Takuya Tsurume, Kanagawa (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/329,624

(22) Filed: Dec. 19, 2011

(65) Prior Publication Data

US 2012/0088324 A1   Apr. 12, 2012

Related U.S. Application Data

(62) Division of application No. 12/341,424, filed on Dec. 22, 2008, now Pat. No. 8,080,811.

(30) Foreign Application Priority Data

Dec. 28, 2007 (JP) .................................. 2007-338575
Feb. 6, 2008 (JP) .................................. 2008-026119

(51) Int. Cl.
*H01L 21/00* (2006.01)
*H01L 21/469* (2006.01)

(52) U.S. Cl.
USPC ............. 438/29; 438/34; 438/35; 438/759; 438/780; 438/795; 257/E51.018; 257/E51.022; 257/40; 430/200; 430/201; 427/148; 427/596

(58) Field of Classification Search ........... 438/29, 438/22, 34, 35, 759, 780, 795; 257/E21.601, 257/E21.615, E51.018, E51.022, 40; 430/200, 430/201; 427/148, 596; 349/690
See application file for complete search history.

(56) References Cited

U.S. PATENT DOCUMENTS 3,992,219 A   11/1976   Clark
4,911,733 A   3/1990   Matsumoto et al.
(Continued)

FOREIGN PATENT DOCUMENTS

EP   0 913 870 A2   5/1999
EP   1 003 354 A1   5/2000
(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, 2007, pp. 161-164.

*Primary Examiner* — Kimberly Rizkallah
*Assistant Examiner* — Maria Ligai
(74) *Attorney, Agent, or Firm* — Husch Blackwell LLP

(57) ABSTRACT

An evaporation donor substrate which enables only a desired evaporation material to be evaporated at the time of deposition by an evaporation method, and capable of reduction in manufacturing cost by increase in use efficiency of the evaporation material and deposition with high uniformity. An evaporation donor substrate capable of controlling laser light so that a desired position of an evaporation donor substrate is irradiated with the laser light in accordance with the wavelength of the emitted laser light at the time of evaporation. Specifically, an evaporation donor substrate in which a region which reflects laser light and a region which absorbs laser light at the time of irradiation with laser light having a wavelength of greater than or equal to 400 nm and less than or equal to 600 nm at the time of evaporation are formed.

33 Claims, 14 Drawing Sheets

U.S. PATENT DOCUMENTS

| | | | |
|---|---|---|---|
| 5,851,709 A * | 12/1998 | Grande et al. | 430/7 |
| 5,937,272 A | 8/1999 | Tang | |
| 6,165,543 A | 12/2000 | Otsuki et al. | |
| 6,283,060 B1 | 9/2001 | Yamazaki et al. | |
| 6,566,032 B1 | 5/2003 | Boroson et al. | |
| 6,586,153 B2 | 7/2003 | Wolk et al. | |
| 6,610,455 B1 | 8/2003 | Burberry et al. | |
| 6,689,492 B1 | 2/2004 | Yamazaki et al. | |
| 6,695,029 B2 | 2/2004 | Phillips et al. | |
| 6,699,597 B2 | 3/2004 | Bellmann et al. | |
| 6,703,179 B2 | 3/2004 | Tyan | |
| 6,776,847 B2 | 8/2004 | Yamazaki et al. | |
| 6,811,938 B2 | 11/2004 | Tutt et al. | |
| 7,223,514 B2 | 5/2007 | Kang et al. | |
| 7,265,489 B2 | 9/2007 | Yamasaki et al. | |
| 7,316,983 B2 | 1/2008 | Yamazaki et al. | |
| 7,378,711 B2 | 5/2008 | Suh et al. | |
| 7,445,825 B2 | 11/2008 | Wolk et al. | |
| 7,674,749 B2 | 3/2010 | Kang et al. | |
| 7,727,847 B2 | 6/2010 | Tanaka et al. | |
| 7,807,483 B2 | 10/2010 | Yamazaki et al. | |
| 7,887,987 B2 | 2/2011 | Matsuo | |
| 7,951,521 B2 | 5/2011 | Matsuo | |
| 2004/0065902 A1 | 4/2004 | Yamazaki et al. | |
| 2004/0191564 A1 | 9/2004 | Kim et al. | |
| 2004/0217695 A1 | 11/2004 | Yoneda et al. | |
| 2005/0005848 A1 | 1/2005 | Yamazaki et al. | |
| 2005/0145326 A1 | 7/2005 | Hatwar | |
| 2005/0157157 A1 | 7/2005 | Tsukamoto et al. | |
| 2006/0233950 A1 | 10/2006 | Kim et al. | |
| 2006/0243377 A1 | 11/2006 | Matsuo et al. | |
| 2006/0246240 A1 * | 11/2006 | Matsuda et al. | 428/32.39 |
| 2008/0026543 A1 | 1/2008 | Miyairi et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |
| 2008/0113292 A1 | 5/2008 | Matsuo | |
| 2008/0182349 A1 | 7/2008 | Yamazaki et al. | |
| 2008/0299496 A1 | 12/2008 | Hirakata et al. | |
| 2008/0305287 A1 | 12/2008 | Ohata et al. | |
| 2009/0075214 A1 | 3/2009 | Hirakata et al. | |
| 2009/0104403 A1 | 4/2009 | Aoyama et al. | |
| 2009/0104721 A1 | 4/2009 | Hirakata et al. | |
| 2009/0104835 A1 | 4/2009 | Aoyama et al. | |
| 2009/0142510 A1 | 6/2009 | Takahashi et al. | |
| 2009/0169809 A1 | 7/2009 | Yokoyama et al. | |

FOREIGN PATENT DOCUMENTS

| | | |
|---|---|---|
| EP | 1 176 642 A2 | 1/2002 |
| JP | 11-237504 | 8/1999 |
| JP | 2000-256877 | 9/2000 |
| JP | 2004-103406 | 4/2004 |
| JP | 2006-309995 | 11/2006 |
| JP | 2007-141702 | 6/2007 |

* cited by examiner

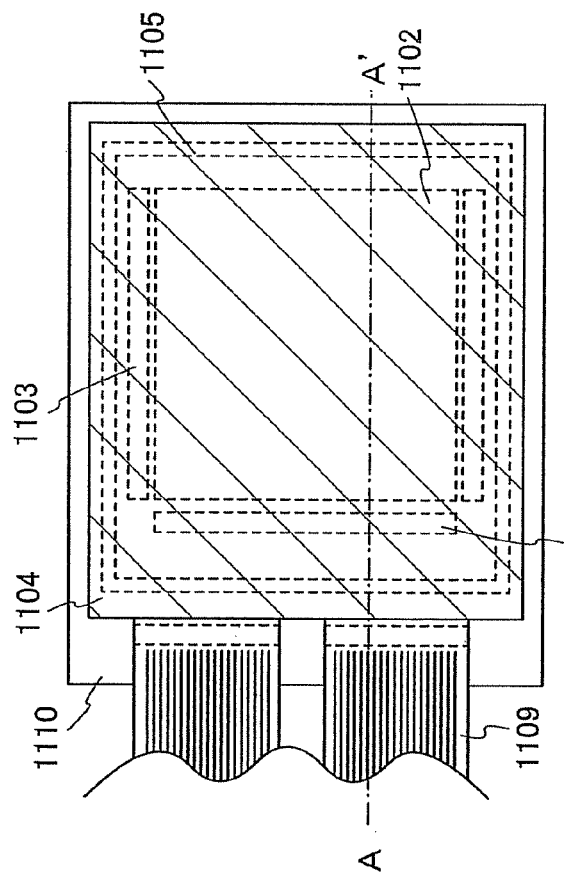
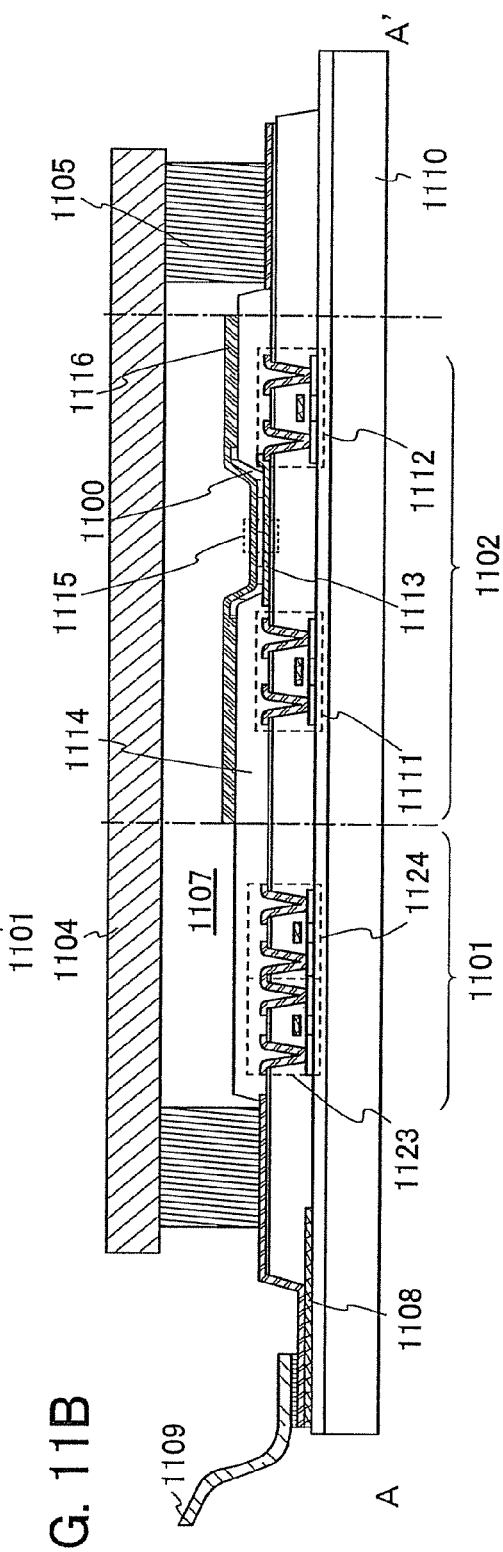
FIG. 11A
FIG. 11B

METHOD FOR MANUFACTURING EVAPORATION DONOR SUBSTRATE AND LIGHT-EMITTING DEVICE

This application is a divisional of U.S. application Ser.No. 12/341,424 filed on Dec. 22, 2008 now U.S. Pat. No. 8,080,811.

BACKGROUND OF THE INVENTION

1. Field of the Invention

The present invention relates to an evaporation donor substrate used for deposition of a material which can be deposited by an evaporation method. In addition, the present invention relates to a method for manufacturing a light-emitting device using the evaporation donor substrate.

2. Description of the Related Art

A light-emitting element using an organic compound as a luminous body, which has features such as thinness, lightness, high-speed response, and DC drive at low voltage, is expected to be applied to a next-generation flat panel display. In particular, a display device in which light-emitting elements are arranged in matrix is considered to have an advantage in a wide viewing angle and excellent visibility over a conventional liquid crystal display device.

It is said that, as for a light-emitting mechanism of a light-emitting element, an EL layer is sandwiched between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excitation states, and it is considered that light can be emitted through either of the two excitation states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

EL materials for forming an EL layer are broadly classified into a low molecular (monomer) material and a high molecular (polymer) material. In general, a low molecular material is often deposited by an evaporation method and a high molecular material is often deposited by an inkjet method or the like.

An evaporation apparatus which is used for an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimed and deposited onto the substrate.

Note that in order to deposit a film uniformly, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition wall (a bank) formed of an insulator provided between the pixels be large. Such demands are major objects in promoting improvement in definition (increase in the number of pixels) of a light-emitting device including a light-emitting element and miniaturization of display pixel pitches along with reduction in size of the light-emitting device including a light-emitting element.

Therefore, as for flat panel displays, in order to achieve improvement in definition and increase in reliability, increase in productivity and reduction in cost are required as well as achievement of those objects.

Thus, a method for forming an EL layer of a light-emitting element through laser thermal transfer has been proposed (see Patent Document 1: Japanese Published Patent Application No. 2006-309995). Patent Document 1 discloses a transfer substrate which includes a photothermal conversion layer having a low-reflective layer and a high-reflective layer, and a transfer layer over a supporting substrate. Irradiation of such a transfer substrate with laser light allows the transfer layer to be transferred to an element-forming substrate.

However, the high-reflective layer and the low-reflective layer of the transfer substrate of Patent Document 1 are stacked on one side of the substrate. Therefore, even with the use of the high-reflective layer, a certain degree of heat absorption is generated. Thus, when the quantity of heat of laser light is large, not only a portion of the transfer layer over the low-reflective layer but also a portion of the transfer layer over the high-reflective layer might be transferred.

Further, in the structure illustrated in FIG. 3 of Patent Document 1, as described in [0041], a gap needs not to be generated between the low-reflective layer and the high-reflective layer, and thus high-accuracy patterning is needed.

Further, in the structure illustrated in FIG. 7 of Patent Document 1, the low-reflective layer is patterned, the high-reflective layer is then formed over the entire surface, and the transfer layer is then formed. In this structure, heat from the low-reflective layer which is heated by absorption of laser light is transferred to the transfer layer through the high-reflective layer. Thus, not only a desired portion of the transfer layer but also the transfer layer around the desired portion might be transferred.

SUMMARY OF THE INVENTION

It is an object of the present invention to provide an evaporation donor substrate, in the case of deposition by an evaporation method, which allows selective evaporation of a desired evaporation material over an evaporation donor substrate in accordance with a wavelength of emitted laser light and which can reduce manufacturing cost by increase in use efficiency of the evaporation material and also can deposit a film with high uniformity.

In addition, it is an object of the present invention to provide, with use of such an evaporation donor substrate, a method for manufacturing a light-emitting device which is capable of promoting improvement in definition (increase in the number of pixels) of a light-emitting device and miniaturization of display pixel pitches along with reduction in size of the light-emitting device.

One feature of the present invention is an evaporation donor substrate which can control laser light so that a desired portion over the same substrate is selectively irradiated with the laser light in accordance with a wavelength of the laser light which is emitted to the evaporation donor substrate at the time of evaporation. Specifically, it is an evaporation donor substrate in which a region which reflects laser light and a region which absorbs laser light at the time of irradiation with laser light having a wavelength of greater than or equal to 400 nm and less than or equal to 600 nm at the time of evaporation are formed.

One feature of the present invention is an evaporation donor substrate including a first function film formed over a substrate; a reflective layer having an opening formed over the first function film; a heat-insulating layer formed over the reflective layer; a second function film formed over the first function film and the heat-insulating layer; a light-absorbing layer formed over the second function film; and a material layer formed over the light-absorbing layer, where the light-absorbing layer is formed of metal nitride, the first function film at a position overlapping with the reflective layer is a reflective film, and a stacked film of the first function film and the second function film is an anti-reflection film.

Note that, in the above-described structure, the first function film functions as a reflective film which reflects light when it is a single layer, and a stacked film of the first function film and the second function film functions as an anti-reflection film which prevents light from being reflected. Thus, the thickness of the first function film which serves as a reflective film and the thickness of the stacked film of the first function film and the second function film which serves as an anti-reflection film are defined as below when a wavelength of light is $\lambda$, a refractive index of the substrate is $n_0(\lambda)$, refractive indices of the first function film and the second function film are $n_1(\lambda)$, a refractive index of the reflective layer is $n_2(\lambda)$, and a refractive index of the light-absorbing layer is $n_3(\lambda)$. Note that the refractive index ($n_2(\lambda)$) of the reflective layer is higher than the above-described refractive indices $n_0(\lambda)$ and $n_1(\lambda)$.

1) In the case of $n_0 < n_1$,
thickness of reflective film: first function film=$\lambda \cdot m_{a1}/4n_{1\,(ma1)}$=even number)
  i) when $n_1 < n_3$,
  thickness of anti-reflection film: first function film+second function film=$\lambda \cdot m_{b1}/4n_1$ ($m_{b1}$=odd number)
  ii) when $n_3 < n_1$,
  thickness of anti-reflection film: first function film+second function film=$\lambda \cdot m_{b2}/4n_1$ ($m_{b2}$=even number),
2) in the case of $n_1 < n_0$,
thickness of reflective film: first function film:=$\lambda \cdot m_{a2}/4n_{1\,(ma2)}$=odd number)
  i) when $n_1 < n_3$,
  thickness of anti-reflection film: first function film+second function film=$\lambda \cdot m_{b3}/4n_1$ ($m_{b3}$=even number)
  ii) when $n_3 < n_1$,
  thickness of anti-reflection film: first function film+second function film=$\lambda \cdot m_{b4}/4n_1$ ($m_{b4}$=odd number).

Another feature of the present invention is an evaporation donor substrate with another structure including a first function film having an opening formed over a substrate; a reflective layer formed over the first function film; a heat-insulating layer formed over the reflective layer; a second function film formed over the substrate and the heat-insulating layer; a light-absorbing layer formed over the second function film; and a material layer formed over the light-absorbing layer, where the light-absorbing layer is formed of metal nitride, the first function film is a reflective film, and the second function film is an anti-reflection film.

Note that, in the above-described structure, the first function film functions as a reflective film which reflects light when it is a single layer, and the second function film functions as an anti-reflection film which prevents light from being reflected when it is a single layer. Thus, the thickness of the first function film which serves as a reflective film and the thickness of the second function film which serves as an anti-reflection film are defined as below when a wavelength of light is $\lambda$, a refractive index of the substrate is $n_0$, a refractive index of the first function film is $n_1'$, a refractive index of the second function film is $n_1''$, a refractive index of the reflective layer is $n_2(\lambda)$, and a refractive index of the light-absorbing layer is $n_3(\lambda)$. Note that the refractive index ($n_2(\lambda)$) of the reflective layer is higher than the above-described refractive indices $n_0(\lambda)$ and $n_1'(\lambda)$.

1) In the case of $n_0 < n_1$,
thickness of reflective film: first function film=$\lambda \cdot m_{a3}/4n_1'$ ($m_{a3}$=even number)
  i) when $n_0 < n_1'' < n_3$,
  thickness of anti-reflection film: second function film=$\lambda \cdot m_{b5}/4n_1''$ ($m_{b5}$=odd number)
  ii) when $n_3 < n_1'' < n_0$,
  thickness of anti-reflection film: second function film=$\lambda \cdot m_{b6}/4n_1''$ ($m_{b6}$=odd number)
  iii) when $n_1' < n_0$, $n_1' < n_3$,
  thickness of anti-reflection film: second function film=$\lambda \cdot m_{b7}/4n_1''$ ($m_{b7}$=even number)
  iv) when $n_0 < n_1''$, $n_3 < n_1''$,
  thickness of anti-reflection film: second function film=$\lambda \cdot m_{b8}/4n_1''$ ($m_{b8}$=even number),
2) in the case of $n_1' < n_0$,
thickness of reflective film: first function film=$\lambda \cdot m_{a4}/4n_1'$ ($m_{a4}$=odd number)
  i) when $n_0 < n_1'' < n_3$,
  thickness of anti-reflection film: second function film=$\lambda \cdot m_{b9}/4n_1''$ ($m_{b9}$=odd number)
  ii) when $n_3 < n_1'' < n_0$,
  thickness of anti-reflection film: second function film=$\lambda \cdot m_{b10}/4n_1''$ ($m_{b10}$=odd number),
  iii) when $n_1'' < n_0$, $n_1'' < n_3$,
  thickness of anti-reflection film: second function film=$\lambda \cdot m_{b11}/4n_1''$ ($m_{b11}$=even number),
  iv) when $n_0 < n_1''$, $n_3 < n_1''$,
  thickness of anti-reflection film: second function film=$\lambda \cdot m_{b12}/4n_1''$ ($m_{b12}$=even number).

It is preferable to use a material having a light-transmitting property for the first function film and the second function film. Specifically, silicon oxide, silicon nitride, silicon oxynitride, silicon nitride oxide, or the like can be used.

The reflective layer in the above-described structure has a reflectance of greater than or equal to 85% with respect to light. The thickness of the reflective layer is preferably greater than or equal to 100 nm. In addition, the reflective layer contains any of aluminum, silver, gold, platinum, copper, an alloy containing aluminum, an alloy containing silver, or indium tin oxide.

Thermal conductivity of a material which is used for the heat-insulating layer in the above-described structure is lower than thermal conductivity of a material which is used for the reflective layer and the light-absorbing layer. In addition, the thickness of the heat-insulating layer is greater than or equal to 10 nm and less than or equal to 2 μm. Moreover, the heat-insulating layer contains any of titanium oxide, silicon oxide, silicon nitride oxide, or zirconium oxide.

The light-absorbing layer in the above-described structure has a reflectance of less than or equal to 70% with respect to light. The thickness of the light-absorbing layer is greater than or equal to 50 nm. In addition, the light-absorbing layer is formed using metal nitride. Specifically, titanium nitride, tantalum nitride, tungsten nitride, molybdenum nitride, or the like is used.

In the above-described structure, the material layer is formed of an organic compound. Note that a case where the material layer contains one or both of a light-emitting material and a carrier-transporting material is included in the present invention.

In addition, another feature of the present invention is a method for manufacturing a light-emitting device using the above-described evaporation donor substrate of the present invention, which includes steps of: placing one of surfaces of a first substrate which is an evaporation donor substrate, having at least a first function film, a reflective layer having an opening formed in contact with the first function film, a heat-insulating layer formed in contact with the reflective layer, a second function film formed in contact with the first function film and the heat-insulating layer, a light-absorbing layer formed of metal nitride and formed in contact with the second function film, and a material layer formed in contact with the light-absorbing layer, and a surface of a second substrate, over which a film is to be deposited so as to face each other and be close to each other; emitting laser light having a wavelength of greater than or equal to 400 nm and less than or equal to 600 nm from the other surface side of the first substrate; heating selectively a part of the material layer at a position overlapping with the opening of the reflective layer; and evaporating the material layer over the surface of the second substrate, over which a film is to be deposited.

Note that, in the above-described structure, the first function film at the position overlapping with the reflective layer is a reflective film, and a stacked film of the first function film and the second function film is an anti-reflection film.

Furthermore, another feature of the present invention is a method for manufacturing a light-emitting device which includes steps of: placing one of surfaces of a first substrate which is an evaporation donor substrate, having at least a first function film having an opening, a reflective layer formed in contact with the first function film, a heat-insulating layer formed in contact with the reflective layer, a second function film formed in contact with the first substrate and the heat-insulating layer, a light-absorbing layer formed of metal nitride and formed in contact with the second function film, and a material layer formed in contact with the light-absorbing layer, and a surface of a second substrate, over which a film is to be deposited so as to face each other and be close to each other; emitting laser light having a wavelength of greater than or equal to 400 nm and less than or equal to 600 nm from the other surface side of the first substrate; heating selectively the material layer at a position overlapping with the opening of the first function film; and evaporating a part of the material layer over the surface of the second substrate, over which a film is to be deposited.

Note that, in the above-described structure, the first function film is a reflective film and the second function film is an anti-reflection film.

Note that, in the above-described structure, the light emitted to the first substrate is laser light having a wavelength of greater than or equal to 400 nm and less than or equal to 600 nm. For example, laser light having a wavelength of 488 nm, 514 nm, 527 nm, 532 nm, or 561 nm can be used.

Further, the above-described laser light may be either pulsed laser light or continuous-wave (CW) laser light. In addition, the shape of a laser spot is preferably linear or rectangular.

Further, the present invention includes, in its category, an electronic device including a light-emitting device as well as a light-emitting device including a light-emitting element. Therefore, a light-emitting device in this specification refers to an image display device, a light-emitting device, and a light source (including an illumination device). Further, the light-emitting device includes any of the following modules in its category: a module in which a connector such as a flexible printed circuit (FPC), tape automated bonding (TAB) tape, or a tape carrier package (TCP) is attached to a light-emitting device; a module having TAB tape or a TCP provided with a printed wiring board at the end thereof; and a module having an integrated circuit (IC) directly mounted on a light-emitting element by a chip on glass (COG) method.

A desired position of the evaporation donor substrate of the present invention can be selectively irradiated with laser light at the time of evaporation using the laser light; accordingly, use efficiency of an evaporation material can be increased, a film which is flat and has no unevenness can be deposited, and a minute pattern can be formed. Thus, manufacturing cost of a light-emitting device manufactured by a deposition method using the evaporation donor substrate of the present invention can be reduced and a light-emitting device having excellent characteristics can be obtained.

BRIEF DESCRIPTION OF THE DRAWINGS

In the accompanying drawings:

FIGS. 11A and 11B are views illustrating an active matrix light-emitting device;

DETAILED DESCRIPTION OF THE INVENTION

Embodiment Modes and Embodiment of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes.

[Embodiment Mode 1]

In Embodiment Mode 1, an evaporation donor substrate according to the present invention and a deposition method using the evaporation donor substrate will be described. Note that a case where an EL layer of a light-emitting element is formed using an evaporation donor substrate will be described in Embodiment Mode 1.

Figure 1A:
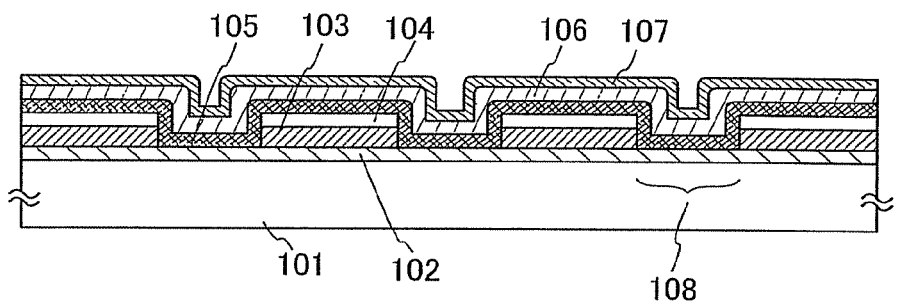
FIGS. 1A to 1C are views illustrating an evaporation donor substrate and a deposition method of the present invention.

A structure of the evaporation donor substrate according to the present invention will be described with reference to FIGS. 1A to 1C. As illustrated in FIG. 1A, a first function film 102 is formed over a first substrate 101 which is a supporting substrate. A reflective layer 103 and a heat-insulating layer 104 are stacked over the first function film 102. The reflective layer 103 and the heat-insulating layer 104 have openings 108.

A second function film 105 is formed over the first function film 102 and the heat-insulating layer 104. A part of the second function film 105 is formed so as to fill the opening 108.

Furthermore, a light-absorbing layer 106 is formed over the second function film 105, and a material layer 107 is formed over the light-absorbing layer 106. In FIG. 1A, the first function film 102, the second function film 105, the light-absorbing layer 106, and the material layer 107 are formed over the entire surface of the first substrate 101.

Note that, since light which is emitted to the first substrate 101 needs to be transmitted through the first substrate 101 at the time of evaporation, the first substrate 101 preferably has high light transmittance. In addition, it is preferable that the first substrate 101 be formed of a material having low thermal conductivity. This is because, with the first substrate 101 having low thermal conductivity, heat obtained from the irradiation light can be efficiently used for evaporation. As the first substrate 101, for example, a glass substrate, a quartz substrate, a plastic substrate containing an inorganic material, or the like can be used.

Further, in the case of the evaporation donor substrate having the structure illustrated in FIG. 1A, the first function film 102 functions as a reflective film which reflects light when it is a single layer, and a stacked film of the first function film 102 and the second function film 105 functions as an anti-reflection film which prevents light from being reflected.

When a wavelength of light emitted to the evaporation donor substrate is $\lambda$, a refractive index of the first substrate 101 is $n_0(\lambda)$, refractive indices of the first function film 102 and the second function film 105 are $n_1(\lambda)$, and a refractive index of the reflective layer 103 is $n_2(\lambda)$, the thickness of the first function film 102 formed over the first substrate 101 is defined as below in order to function as a reflective film. Note that in the case of the structure illustrated in FIG. 1A, the refractive index of the first function film 102 and the refractive index of the second function film 105 are the same. In addition, the refractive index ($n_2(\lambda)$) of the reflective layer 103 is higher than other refractive indices $n_0(\lambda)$ and $n_1(\lambda)$ which are described above.

1) In the case of $n_0 < n_1$,
thickness of first function film $102 = \lambda \cdot m_{a1}/4n_1$ ($m_{a1}$=even number), 2) in the case of $n_1 < n_0$,
thickness of first function film $102 = \lambda \cdot m_{a2}/4n_1$ ($m_{a2}$=odd number).

Figure 6:
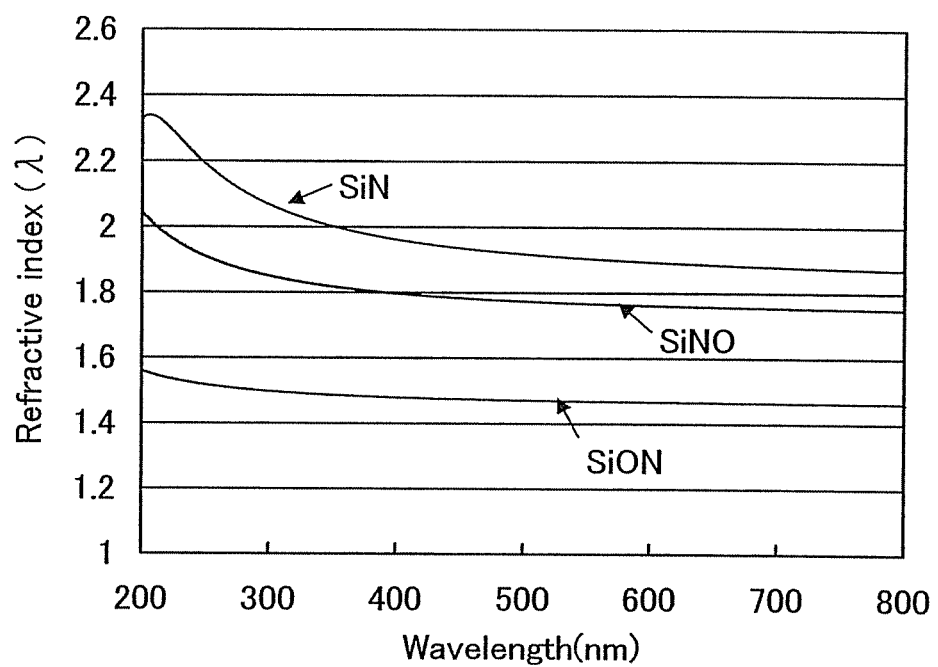
FIG. 6 is a graph showing data of refractive indices.

Further, it is preferable to use a material having a light-transmitting property, preferably a material having a light transmittance of greater than or equal to 10%, for the first function film 102. Specifically, silicon oxide, silicon nitride, silicon oxynitride, silicon nitride oxide, or the like can be used. Note that the refractive index of each of silicon nitride, silicon nitride oxide, and silicon oxynitride, which are light-transmitting materials that can be used for the first function film 102, with respect to wavelengths is shown in FIG. 6.

Further, in order that a part of the light-absorbing layer 106 is selectively irradiated with light at the time of evaporation, the reflective layer 103 serves as a layer for reflecting light emitted to the light-absorbing layer 106 other than the part of the light-absorbing layer 106. Therefore, the reflective layer 103 is preferably formed of a material having a high reflectance with respect to irradiation light. Specifically, the reflective layer 103 preferably has a reflectance of greater than or equal to 85%, more preferably, a reflectance of greater than or equal to 90% with respect to the irradiation light.

Further, as a material which can be used for the reflective layer 103, for example, silver, gold, platinum, copper, an alloy containing aluminum (e.g., an aluminum-titanium alloy and an aluminum-neodymium alloy), an alloy containing silver (a silver-neodymium alloy), indium tin oxide, or the like can be used.

Note that the reflective layer 103 can be formed by any of various kinds of methods. For example, the reflective layer 103 can be formed by a sputtering method, an electron beam evaporation method, a vacuum evaporation method, or the like. It is preferable that the thickness of the reflective layer 103 be about greater than or equal to 100 nm although it depends on a material. With a thickness of greater than or equal to 100 nm, transmission of the irradiation light through the reflective layer can be suppressed.

The heat-insulating layer 104 is a layer for preventing heat from being conducted to the light-absorbing layer 106 and the material layer 107, which are formed later, if the irradiation light at the time of evaporation which is reflected by the reflective layer 103 partially remains as heat in the reflective layer 103. Therefore, the heat-insulating layer 104 of the present invention needs to be formed using a material which has low thermal conductivity. Specifically, the heat-insulating layer 104 needs to be formed using a material which has lower thermal conductivity than materials forming the reflective layer 103 and the light-absorbing layer 106.

As a material which is used for the heat-insulating layer 104, for example, titanium oxide, silicon oxide, silicon nitride oxide, zirconium oxide, or the like can be used.

Note that the heat-insulating layer 104 can be formed by any of various kinds of methods. For example, the heat-insulating layer 104 can be formed by a sputtering method, an electron beam evaporation method, a vacuum evaporation method, a CVD method, or the like. In addition, it is preferable that the thickness of the heat-insulating layer 104 be greater than or equal to 10 nm and less than or equal to 2 μm, more preferably, greater than or equal to 100 nm and less than or equal to 600 nm although it depends on a material. With a thickness of greater than or equal to 10 nm and less than or equal to 2 μm, the heat-insulating layer 104 has an effect of preventing heat included in the reflective layer 103 from being conducted to the light-absorbing layer 106 or the material layer 107.

In this embodiment mode, the openings 108 are formed in the reflective layer 103 and the heat-insulating layer 104. Although the openings 108 can be formed by any of various kinds of methods, the openings 108 are preferably formed by dry etching. By use of dry etching, a minute pattern can be formed.

The second function film 105 is formed over the heat-insulating layer 104 and the first function film 102. It is preferable to use a material having a light-transmitting property, preferably a material having a light transmittance of greater than or equal to 10%, for the second function film 105. Specifically, silicon oxide, silicon nitride, silicon oxynitride, silicon nitride oxide, or the like can be used. In addition, the material used for the second function film 105 may be the same as the material used for the first function film 102 which is formed earlier. Moreover, the refractive index of each of silicon nitride, silicon nitride oxide, and silicon oxynitride, which are light-transmitting materials that can be used for the second function film 105, with respect to wavelengths is shown in FIG. 6.

When a wavelength of light emitted to the evaporation donor substrate is $\lambda$, a refractive index of the first substrate 101 is $n_0(\lambda)$, refractive indices of the first function film 102 and the second function film 105 are $n_1(\lambda)$, and a refractive index of the light-absorbing layer 106 is $n_3(\lambda)$, the thickness of the stacked film of the first function film 102 and the second function film 105 is defined as below so that the stacked film of the second function film 105 which is formed here and the first function film 102 which is formed earlier functions as an anti-reflection film. Note that in the case of the structure illustrated in FIG. 1A, the refractive index of the first function film 102 and the refractive index of the second function film 105 are the same. Note that, in the case where the refractive index of the first function film 102 and the refractive index of the second function film 105 are different, the thickness may be set as appropriate so that the stacked film of the first function film 102 and the second function film 105 serves as an anti-reflection film.

1) In the case of $n_0 < n_1 < n_3$,
thickness of first function film 102+thickness of second function film $105 = \lambda \cdot m_{b1}/4n_1$ ($m_{b1}$=odd number),
2) in the case of $n_0 < n_1$, $n_3 < n_1$,
thickness of first function film 102+thickness of second function film $105 = \lambda \cdot m_{b2}/4n_1$ ($m_{b2}$=even number),
3) in the case of $n_1 < n_0$, $n_1 < n_3$,
thickness of first function film 102+thickness of second function film $105 = \lambda \cdot m_{b3}/4n_1$ ($m_{b3}$=even number),
4) in the case of $n_3 < n_1 < n_0$,
thickness of first function film 102+thickness of second function film $105 = \lambda \cdot m_{b4}/4n_1$ ($m_{b4}$=odd number).

The light-absorbing layer 106 absorbs light which is emitted at the time of evaporation. Therefore, it is preferable that the light-absorbing layer 106 be formed of a material which has low reflectance and high absorptance with respect to irradiation light. Specifically, it is preferable that the light-absorbing layer 106 have a reflectance of less than or equal to 70% with respect to irradiation light.

In the present invention, metal nitride is used for the light-absorbing layer 106. Specifically titanium nitride, tantalum nitride, molybdenum nitride, tungsten nitride, or the like can be used. Note that the light-absorbing layer 106 is not limited to a single layer and may be formed of a plurality of layers.

The light-absorbing layer 106 can be formed by any of various kinds of methods. For example, the light-absorbing layer 106 can be formed by a sputtering method, an electron beam evaporation method, a vacuum evaporation method, or the like.

Further, although the thickness of the light-absorbing layer 106 depends on a material, it is preferable that the light-absorbing layer 106 have a thickness with which irradiation light is not transmitted (preferably, a thickness of greater than or equal to 100 nm and less than or equal to 2 μm). In particular, with a thickness of greater than or equal to 200 nm and less than or equal to 600 nm, the light-absorbing layer 106 can efficiently absorb the irradiation light to generate heat. Moreover, with a thickness of greater than or equal to 200 nm and less than or equal to 600 nm, the light-absorbing layer 106 can be deposited accurately over a deposition target substrate.

The light-absorbing layer 106 may partially transmit irradiation light as long as an evaporation material contained in the material layer 107 can be heated to the sublimation temperature thereof. Note that, in the case where the light-absorbing layer 106 partially transmits the irradiation light, it is preferable that a material which is not decomposed by light be used as the evaporation material contained in the material layer 107.

Furthermore, the greater the difference in reflectance between the reflective layer 103 and the light-absorbing layer 106 is, the more preferable it is. Specifically, the difference in the reflectance with respect to the wavelength of the irradiation light is preferably greater than or equal to 25%, more preferably greater than or equal to 30%.

The material layer 107 contains an evaporation material which is evaporated over the deposition target substrate. When the evaporation donor substrate is irradiated with light, the evaporation material contained in the material layer 107 is heated to be sublimed and evaporated over the deposition target substrate.

Note that, although any of a variety of materials can be used as the evaporation material contained in the material layer 107 regardless of whether they are organic compounds or inorganic compounds as long as the material can be evaporated, in the case of forming an EL layer of a light-emitting element as described in this embodiment mode, a material which can be evaporated to form an EL layer is used. For example, an organic compound which forms an EL layer, such as a light-emitting material or a carrier-transporting material, or an inorganic compound which is used for an electrode of a light-emitting element, such as metal oxide, metal nitride, metal halide, or an elementary substance of metal, as well as a carrier-transporting layer or a carrier-injecting layer included in an EL layer, can be used. Note that details of the materials which can be evaporated to form an EL layer is given not here but in Embodiment Mode 4; therefore, Embodiment Mode 4 is referred to for the details, and description is omitted in this embodiment mode.

The material layer 107 may contain a plurality of materials. In addition, the material layer 107 may be a single layer or a stack of a plurality of layers. Accordingly, stacking a plurality of layers each containing an evaporation material enables co-evaporation. Note that in the case where the material layer 107 has a stacked-layer structure, it is preferable that the layers be stacked so that an evaporation material having a low sublimation temperature (or a material which can be evaporated at a low temperature) be contained in a layer on the first substrate 101 side. Such a structure makes it possible to sufficiently perform evaporation using the material layer 107 which has a stacked-layer structure.

The material layer 107 is formed by any of various kinds of methods. For example, a wet method such as a spin coating method, a spray coating method, an ink-jet method, a dip coating method, a casting method, a die coating method, a roll coating method, a blade coating method, a bar coating method, a gravure coating method, or a printing method can be used. Alternatively, a dry method such as a vacuum evaporation method or a sputtering method can be used.

In order to form the material layer 107 by a wet method, a predetermined evaporation material may be dissolved or dispersed in a solvent, and a solution or a dispersion liquid may be adjusted. There is no particular limitation on the solvent as long as it can dissolve or disperse the evaporation material and it does not react with the evaporation material. For example, as the solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used. By use of a wet method, it is possible to increase use efficiency of a material, which leads to reduction in manufacturing cost.

Note that in the case where the thickness and uniformity of a film which is formed over the deposition target substrate with the material layer 107 are controlled, the thickness and uniformity of the material layer 107 needs to be controlled. However, the material layer 107 does not need to be a uniform layer if the thickness and uniformity of a film which is formed over the deposition target substrate is not affected. For example, the material layer 107 may be formed in a minute island shape or may have unevenness.

Figure 1B:
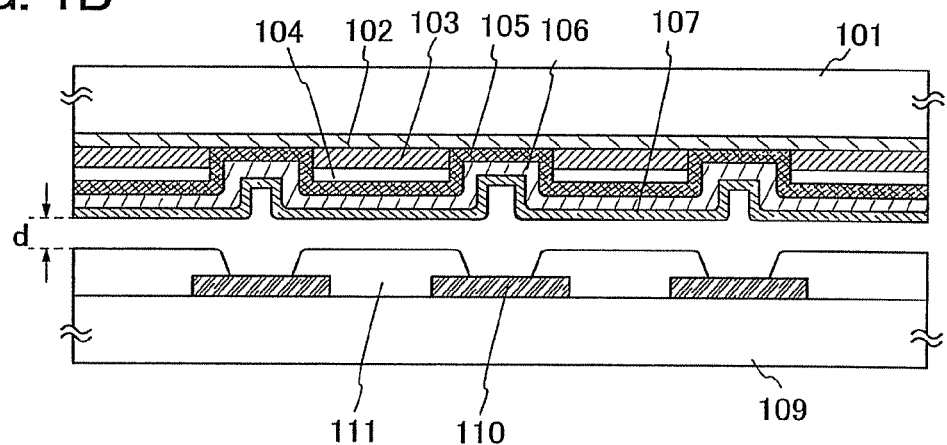

Next, as illustrated in FIG. 1B, a second substrate 109 which is a deposition target substrate is placed at a position facing a surface which is one of surfaces of the first substrate 101 and on which the first function film 102, the reflective layer 103, the heat-insulating layer 104, the second function film 105, the light-absorbing layer 106, and the material layer 107 are formed. The second substrate 109 is a deposition target substrate over which a desired layer is formed through an evaporation process. Note that, since the case where an EL layer of a light-emitting element is formed using the evaporation donor substrate of the present invention is described here, a first electrode 110 which serves as one of electrodes of the light-emitting element and an insulator 111 are formed over the second substrate 109. Then, the first substrate 101 and the second substrate 109 are made to face each other in proximity: specifically, they are brought close to face each other so that the distance d between the surface of the material layer 107 on the first substrate 101 and the surface of the second substrate 109 is greater than or equal to 0 mm and less than or equal to 2 mm, preferably greater than or equal to 0 mm and less than or equal to 0.05 mm, or more preferably greater than or equal to 0 mm and less than or equal to 0.03 mm.

Note that the distance d is defined as the distance between the surface of the material layer 107 on the first substrate 101 and the surface of the second substrate 109. Therefore, in the case where some layer (e.g., a conductive layer which functions as an electrode or an insulator which functions as a partition wall) is formed over the second substrate 109, the distance d is defined as the distance between the surface of the material layer 107 on the first substrate 101 and the outermost surface of the layer formed over the second substrate 109. Note that, if the surface of the material layer 107 on the first substrate 101 or the outermost surface of the layer formed over the second substrate 109 has projections and depressions, the distance d is defined as the shortest distance between the surface of the material layer 107 on the first substrate 101 and the outermost surface of the layer formed over the second substrate 109.

Figure 1C:
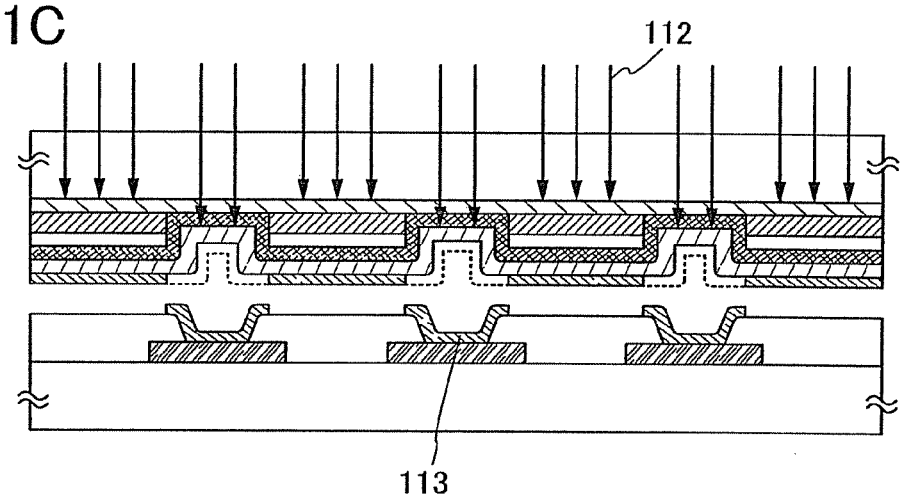

Next, as illustrated in FIG. 1C, irradiation with light 112 is performed from a rear surface (a surface over which the first function film 102, the reflective layer 103, the heat-insulating layer 104, the second function film 105, the light-absorbing layer 106, and the material layer 107 are not formed) side of the first substrate 101. At this time, the light emitted to the first function film 102 formed at a position overlapping with the reflective layer 103 and the reflective layer 103, which are formed on the first substrate 101, is reflected, whereas light emitted to the opening 108 is transmitted through the stacked film of the first function film 102 and the second function film 105 which functions as an anti-reflection film to be absorbed by the light-absorbing layer 106. Then, the light-absorbing layer 106 gives the heat obtained from the absorbed light to the evaporation material contained in the material layer 107 to sublime the evaporation material. Thus, the evaporation material is evaporated over the first electrode 110 formed over the second substrate 109. Accordingly, an EL layer 113 of a light-emitting element is formed over the second substrate 109.

As the irradiation light 112, laser light having a wavelength of greater than or equal to 400 nm and less than or equal to 600 nm is used. For example, laser light having a wavelength of 488 nm, 514 nm, 527 nm, 532 nm, or 561 nm can be used. With use of laser light, thermal conversion in the light-absorbing layer 106 is performed efficiently, which leads to efficient sublimation of the evaporation material.

As the laser light, it is possible to use light oscillated from one or more of a gas laser such as an Ar laser, a Kr laser, or an excimer laser; a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, or a Ti:sapphire laser. Alternatively, a second harmonic or a third harmonic oscillated from the above-described solid-state laser can be used. Note that, when a solid-state laser whose laser medium is solid is used, there are advantages in that a maintenance-free condition can be maintained for a long time and output is relatively stable.

Further, the above-described laser light may be either continuous-wave (CW) laser light or pulsed laser light. In addition, the shape of a laser spot is preferably linear or rectangular.

In the present invention, the material layer 107 is heated not with radiation heat from the irradiation light but with the irradiation light absorbed by the light-absorbing layer 106. Therefore, it is preferable to set irradiation time of light to be short so that an area of the material layer 107 which is heated is not enlarged due to conduction of heat in a plane direction from a part of the light-absorbing layer 106 which is irradiated with the light to a part of the light-absorbing layer 106 which is not irradiated with light.

It is preferable that evaporation by light irradiation be performed in a reduced-pressure atmosphere. Accordingly, it is preferable that the deposition chamber have a pressure of less than or equal to $5 \times 10^{-3}$ Pa, more preferably greater than or equal to $10^{-6}$ Pa and less than or equal to $10^{-4}$ Pa.

Figure 2A:
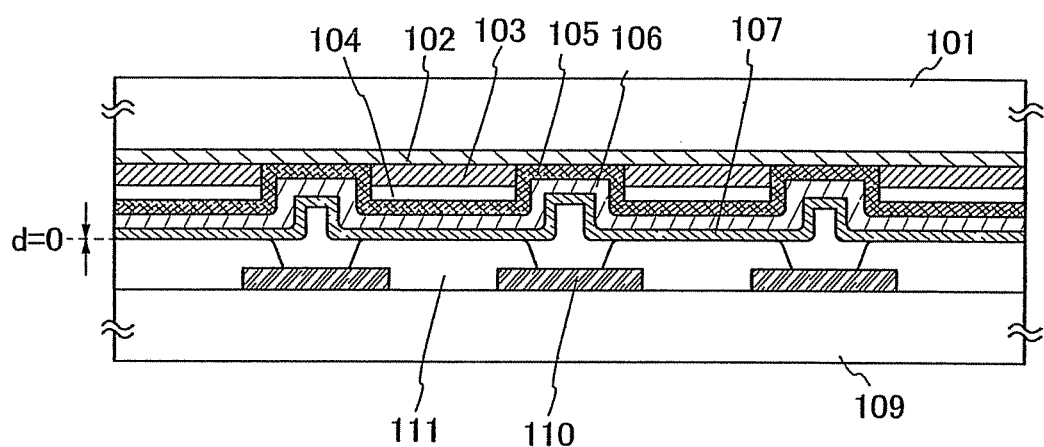
FIGS. 2A and 2B are views illustrating an evaporation donor substrate and a deposition method of the present invention.
Figure 2B:
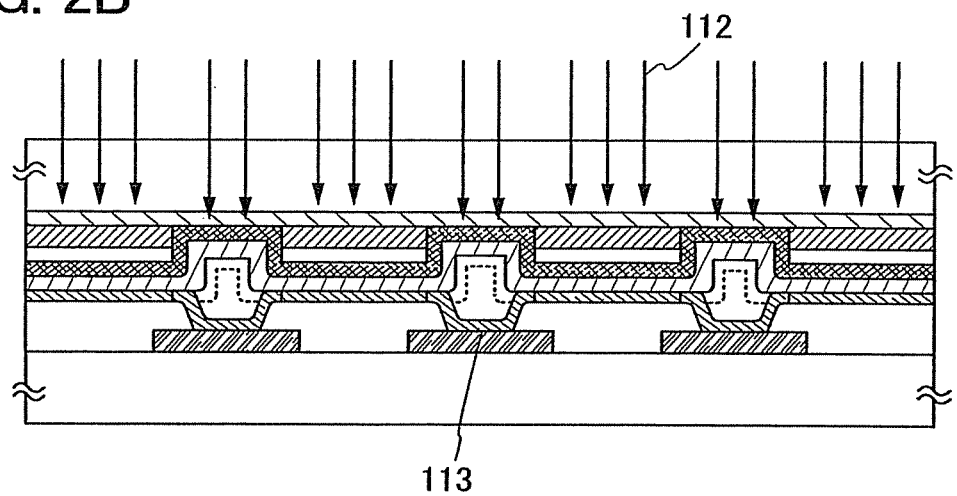

Further, FIG. 2A illustrates a case where the distance d between the first substrate 101 and the second substrate 109 is 0 mm. That is, the case is described where the material layer 107 which is formed on the first substrate 101 and the insulator 111 which is the outermost layer of the layers formed over the second substrate 109 are in contact with each other. By reduction in the distance d as described above, excessive loss of the material can be prevented, and thus use efficiency of a material can be increased. In addition, at the time of the irradiation with light as illustrated in FIG. 2B, the shape of a film which is evaporated over the second substrate 109 can be formed very accurately. Note that, in the case where the surface of the second substrate 109 does not have projections and depressions, it is preferable that the material layer 107 on the first substrate 101 be not in contact with a surface of the second substrate 109, over which a film is to be formed.

Figure 3A:
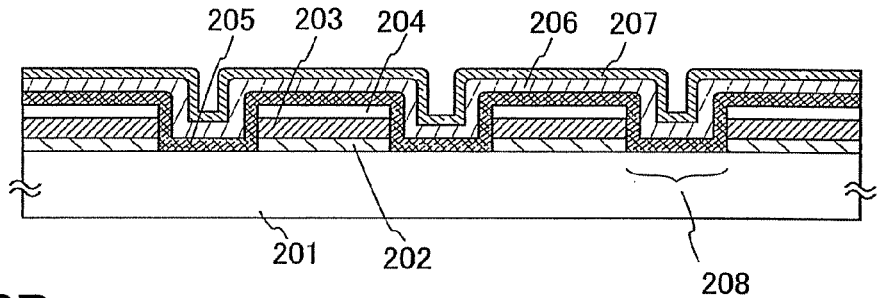
FIGS. 3A to 3D are views illustrating an evaporation donor substrate and a deposition method of the present invention.

The evaporation donor substrate of the present invention may have a structure illustrated in FIG. 3A as an alternative to the structure illustrated in FIG. 1A. In the structure illustrated in FIG. 3A, a first function film 202, a reflective layer 203, and a heat-insulating layer 204 are sequentially stacked over a first substrate 201; openings 208 are faulted; a second function film 205 is formed over the first substrate 201 and the heat-insulating layer 204; and a light-absorbing layer 206 and a material layer 207 are formed over the second function film 205.

Note that, in the case of the evaporation donor substrate having the structure illustrated in FIG. 3A, the first function film 202 functions as a reflective film which reflects light, whereas the second function film 205 functions as an anti-reflection film which prevents light from being reflected.

When a wavelength of light emitted to the evaporation donor substrate is $\lambda$, a refractive index of the first substrate 201 is $n_0(\lambda)$, a refractive index of the first function film 202 is $n_1'(\lambda)$, and a refractive index of the reflective layer 203 is $n_2(\lambda)$, the thickness of the first function film 202 is defined as below in order to function as a reflective film. In addition, the refractive index ($n_2(\lambda)$) of the reflective layer 203 is higher than other refractive indices $n_0(\lambda)$ and $n_1'(\lambda)$ which are described above.

1) In the case of $n_0 < n_1'$,
thickness of first function film $202 = \lambda \cdot m_{a3}/4n_1'$ ($m_{a3}$=even number), 2) in the case of $n_1' < n_0$,
thickness of first function film $202 = \lambda \cdot m_{a4}/4n_1'$ ($m_{a4}$=odd number).

Further, when a wavelength of light emitted to the evaporation donor substrate is $\lambda$, a refractive index of the first substrate 201 is $n_0(\lambda)$, a refractive index of the second function film 205 is $n_1''(\lambda)$, and a refractive index of the light-absorbing layer 206 is $n_3(\lambda)$, the thickness of the second function film 205 is defined as below in order to function as an anti-reflection film.

1) In the case of $n_0 < n_1'' < n_3$,
thickness of second function film $205 = \lambda \cdot m_{b5}/4n_1''$ ($m_{b5}$=odd number), 2) in the case of $n_3 < n_1'' < n_0$,
thickness of second function film $205 = \lambda \cdot m_{b6}/4n_1''$ ($m_{b6}$=odd number), 3) in the case of $n_1'' < n_0$, $n_1'' < n_3$,
thickness of second function film $205 = \lambda \cdot m_{b7}/4n_1''$ ($m_{b7}$=even number), 4) in the case of $n_0 < n_1''$, $n_3 < n_1''$,
thickness of second function film $205 = \lambda \cdot m_{b8}/4n_1''$ ($m_{b8}$=even number).

Further, the structure of the reflective layer 203, the heat-insulating layer 204, the light-absorbing layer 206, and the material layer 207 in FIG. 3A is the same as that of the reflective layer 103, the heat-insulating layer 104, the light-absorbing layer 106, and the material layer 107 in FIG. 1A.

Figure 3B:
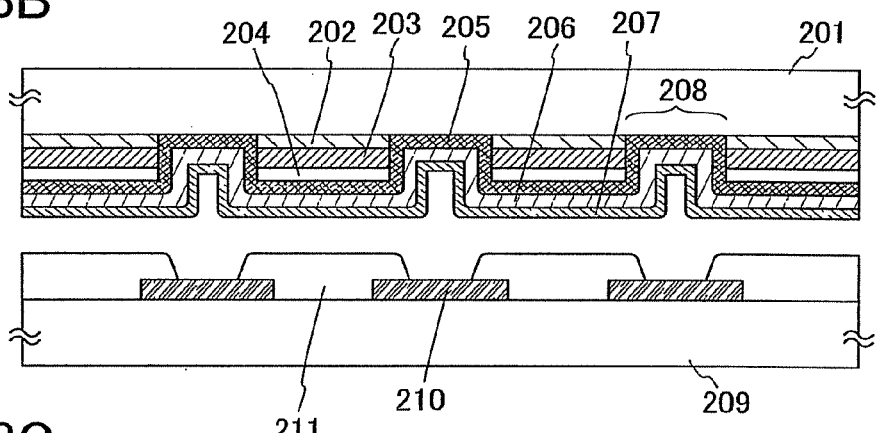

Note that the case of the evaporation donor substrate illustrated in FIG. 3A is similar to the case of the evaporation donor substrate illustrated in FIG. 1A. As illustrated in FIG. 3B, a second substrate 209 which is a deposition target substrate is placed in a position facing a surface which is one of surfaces of the first substrate 201 and on which the first function film 202, the reflective layer 203, the heat-insulating layer 204, the second function film 205, the light-absorbing layer 206, and the material layer 207 are formed. A first electrode 210 which serves as one of electrodes of a light-emitting element and an insulator 211 are formed over the second substrate 209.

Figure 3C:
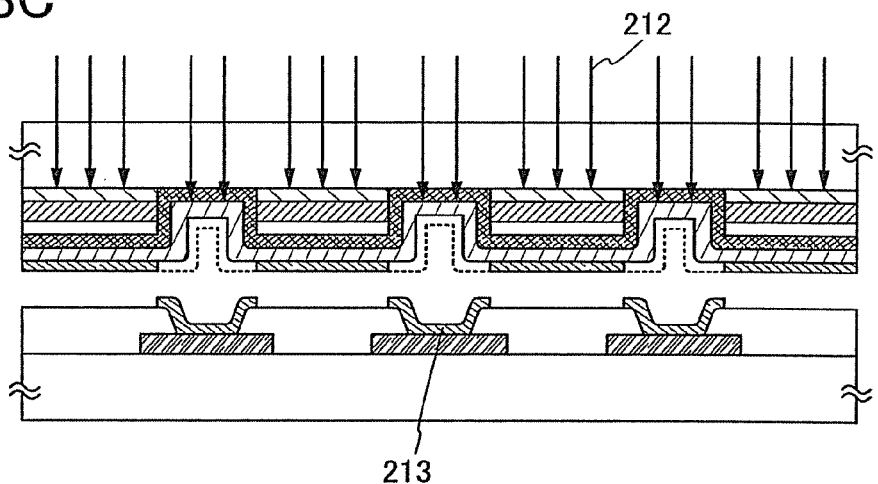

As illustrated in FIG. 3C, irradiation with light 212 is performed from a rear surface (a surface over which the first function film 202, the reflective layer 203, the heat-insulating layer 204, the second function film 205, the light-absorbing layer 206, and the material layer 207 are not formed) side of the first substrate 201. At this time, light emitted to the first function film 202 and the reflective layer 203 formed on the first substrate 201 is reflected, whereas light emitted to the openings 208 is transmitted through the second function film 205 which functions as an anti-reflection film to be absorbed by the light-absorbing layer 206. Then, the light-absorbing layer 206 provides the heat obtained from the absorbed light to an evaporation material contained in the material layer 207 to sublime the evaporation material. Thus, the evaporation material is evaporated over a first electrode 210 formed over the second substrate 209. Accordingly, an EL layer 213 of the light-emitting element is formed over the second substrate 209.

Figure 3D:
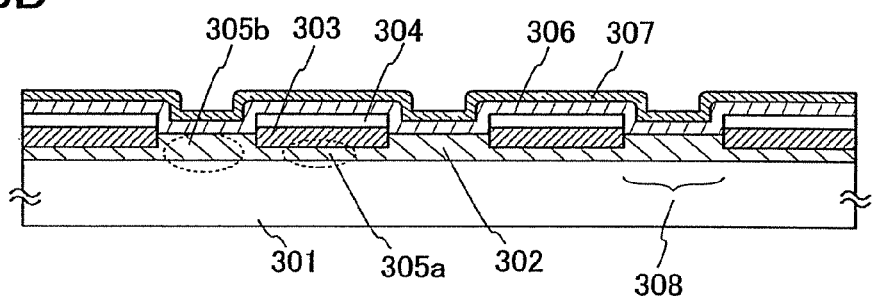

Furthermore, the evaporation donor substrate of the present invention may have a structure illustrated in FIG. 3D. In the structure illustrated in FIG. 3D, a first function film 302 whose thickness varies from part to part is formed over a first substrate 301; a reflective layer 303 and a heat-insulating layer 304 are sequentially stacked; openings 308 are formed; and a light-absorbing layer 306 and a material layer 307 are sequentially stacked over the first function film 302 and the heat-insulating layer 304.

Note that, in the case of the evaporation donor substrate having the structure illustrated in FIG. 3D, a region a (305a) of the first function film 302, which is a portion overlapping with the reflective layer 303, functions as a reflective film which reflects light, whereas a region b (305b) of the first function film 302, which is a portion not overlapping with the reflective layer 303, functions as an anti-reflection film which prevents light from being reflected.

When a wavelength of light emitted to the evaporation donor substrate is $\lambda$, a refractive index of the first substrate 301 is $n_0(\lambda)$, a refractive index of the first function film 302 is $n_1'''(\lambda)$, and a refractive index of the reflective layer 303 is $n_2(\lambda)$, the thickness of the region a (305a) of the first function film 302 is defined as below in order to function as a reflective film. In addition, the refractive index ($n_2(\lambda)$) of the reflective layer 303 is higher than other refractive indices $n_0(\lambda)$ and $n_1'''(\lambda)$ which are described above.

1) In the case of $n_0 < n_1'''$,
thickness of region a (305a) of first function film=$\lambda \cdot m_{a5}/4n_1'''$ ($m_{a5}$=even number), 2) in the case of $n_1''' < n_0$,
thickness of region a (305a) of first function film=$\lambda \cdot m_{a6}/4n_1'''$ ($m_{a6}$=odd number).

Further, when a wavelength of light emitted to the evaporation donor substrate is $\lambda$, a refractive index of the first substrate 301 is $n_0(\lambda)$, a refractive index of the first function film 302 is $n_1'''(\lambda)$, and a refractive index of the light-absorbing layer 306 is $n_3(\lambda)$, the thickness of the region b (305b) of the first function film 302 is defined as below in order to function as an anti-reflection film.

1) In the case of $n_0 < n_1''' < n_3$,
thickness of region b (305b) of first function film=$\lambda \cdot m_{b13}/4n_1'''$ ($m_{b13}$=odd number), 2) in the case of $n_1''' < n_0$, $n_1''' < n_3$,
thickness of region b (305b) of first function film=$\lambda \cdot m_{b14}/4n_1'''$ ($m_{b14}$=even number), 3) in the case of $n_0 < n_1'''$, $n_3 < n_1'''$,
thickness of region b (305b) of first function film=$\lambda \cdot m_{b15}/4n_1'''$ ($m_{b15}$=even number), 4) in the case of $n_3 < n_1''' < n_0$,
thickness of region b (305b) of first function film=$\lambda \cdot m_{b16}/4n_1'''$ ($m_{b16}$=odd number).

Further, in this embodiment mode, although the case is described where the second substrates 109 and 209 are positioned below the first substrates 101 and 201 respectively, the present invention is not limited thereto. The direction of the substrates to be placed can be determined as appropriate.

A desired position of the evaporation donor substrate described in this embodiment mode can be selectively irradiated with laser light at the time of evaporation using the laser light; accordingly, use efficiency of an evaporation material can be increased, a film which is flat and has no unevenness can be deposited, and a minute pattern can be formed. Thus, manufacturing cost of a light-emitting device manufactured using the evaporation donor substrate described in this embodiment mode can be reduced and a light-emitting device having excellent characteristics can be obtained.

[Embodiment Mode 2]

In Embodiment Mode 2, a method for manufacturing a light-emitting device which is capable of full-color display by formation of an EL layer of a light-emitting element with use of a plurality of evaporation donor substrates described in Embodiment Mode 1 will be described.

Although the case where EL layers formed of the same material are formed over the plurality of electrodes formed over a second substrate, which is a deposition target substrate, through one deposition process is described in Embodiment Mode 1, the case where any of EL layers of three different emission colors are formed over the plurality of electrodes over the second substrate will be described in Embodiment Mode 2.

First, three evaporation donor substrates each of which is the evaporation donor substrate illustrated in FIG. 1A in Embodiment Mode 1 are prepared. Note that material layers containing evaporation materials for forming EL layers which emit different colors are provided for the three respective evaporation donor substrates. Specifically, a first evaporation donor substrate having a material layer (R) containing an evaporation material for forming an EL layer which emits red light (an EL layer (R)), a second evaporation donor substrate having a material layer (G) containing an evaporation material for forming an EL layer which emits green light (an EL layer (G)), and a third evaporation donor substrate having a material layer (B) containing an evaporation material for forming an EL layer which emits blue light (an EL layer (B)) are prepared.

In addition, one deposition target substrate having a plurality of first electrodes illustrated in FIG. 1B in Embodiment Mode 1 is prepared. Note that since edges of the plurality of first electrodes are covered with an insulator, a light-emitting region corresponds to a part of the first electrode, which is exposed without overlapping with the insulator.

First, for a first deposition process, the deposition target substrate and the first evaporation donor substrate are superimposed on each other and aligned with each other in a similar manner to FIG. 1B. It is preferable that the deposition target substrate be provided with an alignment marker. It is preferable that the first evaporation donor substrate be also provided with an alignment marker. Note that, since the first evaporation donor substrate is provided with the light-absorbing layer, a portion of the light-absorbing layer which is near the alignment marker is preferably removed in advance. In addition, since the first evaporation donor substrate is provided with the material layer (R), a portion of the material layer (R) which is near the alignment marker is also preferably removed in advance.

Then, irradiation with light is performed from a rear surface (a surface over which the first function film 102, the reflective layer 103, the heat-insulating layer 104, the second function film 105, the light-absorbing layer 106, and the material layer 107, which are illustrated in FIG. 1A, are not formed) side of the first evaporation donor substrate. The light-absorbing layer absorbs the irradiation light and gives heat to the material layer (R) to sublime the evaporation material contained in the material layer (R). Thus, an EL layer (R) is formed over some of the first electrodes over the deposition target substrate. After the first deposition is completed, the first evaporation donor substrate is moved away from the deposition target substrate.

Next, for a second deposition process, the deposition target substrate and the second evaporation donor substrate are superimposed on each other and aligned with each other. The second evaporation donor substrate is provided with openings each at a position which is shifted by one pixel from that of the opening of the first evaporation donor substrate used in the first deposition.

Then, irradiation with light is performed from a rear surface (a surface over which the first function film 102, the reflective layer 103, the heat-insulating layer 104, the second function film 105, the light-absorbing layer 106, and the material layer 107, which are illustrated in FIG. 1A, are not formed) side of the second evaporation donor substrate. The light-absorbing layer absorbs the irradiation light and gives heat to the material layer (G) to sublime the evaporation material contained in the material layer (G). Thus, an EL layer (G) is formed over some of the first electrodes over the deposition target substrate, which are next to the first electrodes over which the EL layer (R) is formed in the first deposition. After the second deposition is completed, the second evaporation donor substrate is moved away from the deposition target substrate.

Next, for a third deposition process, the deposition target substrate and the third evaporation donor substrate are superimposed on each other and aligned with each other. The third evaporation donor substrate is provided with openings of the reflective layer each at a position which is shifted by two pixels from that of the opening of the first evaporation donor substrate used in the first deposition.

Figure 4A:
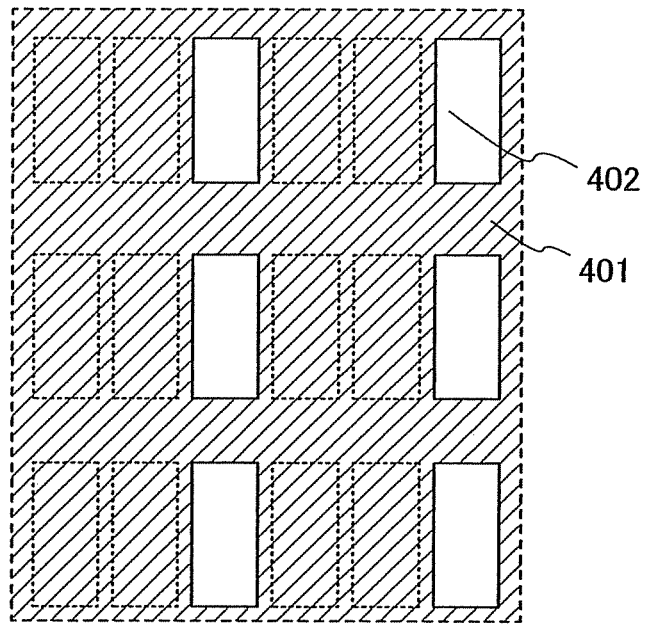
FIGS. 4A and 4B are views illustrating a deposition method of the present invention.

Then, irradiation with light is performed from a rear surface (a surface over which the first function film 102, the reflective layer 103, the heat-insulating layer 104, the second function film 105, the light-absorbing layer 106, and the material layer 107, which are illustrated in FIG. 1A, are not formed) side of the third evaporation donor substrate. A state right before the third deposition is performed corresponds to the top view of FIG. 4A. In FIG. 4A, a reflective layer 401 has openings 402. Accordingly, light which is transmitted through the openings 402 of the reflective layer 401 of the third evaporation donor substrate is transmitted through the heat-insulating layer and is absorbed by the light-absorbing layer. In addition, first electrodes are formed in regions of the deposition target substrate, which overlap with the openings 402 of the third evaporation donor substrate. Note that the EL layer (R) 411 formed through the first deposition and the EL layer (G) 412 formed through the second deposition are located under regions indicated by dotted lines in FIG. 4A.

Figure 4B:
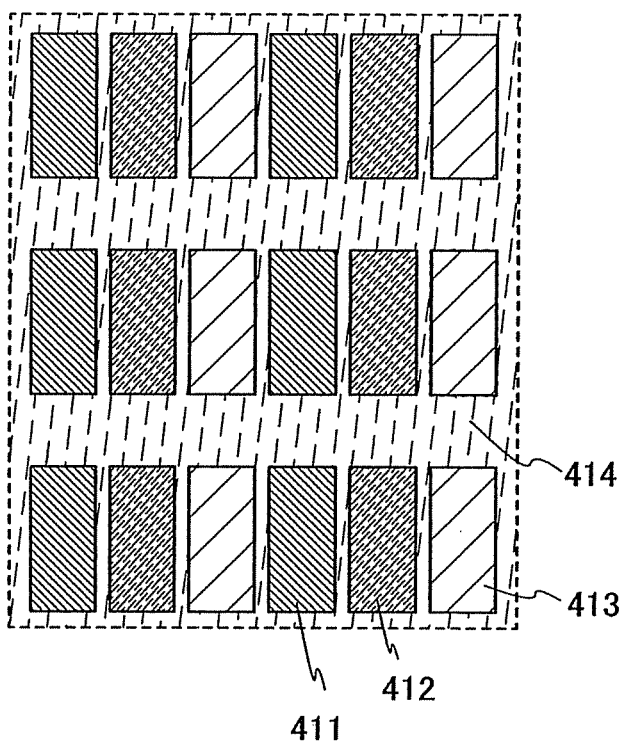

Then, as illustrated in FIG. 4B, the EL layer (B) 413 is formed through the third deposition. The light-absorbing layer absorbs the irradiation light and provides heat to the material layer (B) to sublime the evaporation material contained in the material layer (B). Thus, the EL layer (B) 413 is formed over some of the first electrodes over the deposition target substrate, which are next to the first electrodes over which the EL layer (G) 412 is formed in the second deposition. After the third deposition is completed, the second evaporation donor substrate is moved away from the deposition target substrate.

In this manner, the EL layer (R) 411, the EL layer (G) 412, and the EL layer (B) 413 can be formed at regular intervals over one deposition target substrate. Then, second electrodes are formed over these layers, and thus light-emitting elements can be formed.

Through the above-described steps, the light-emitting elements which emit different colors are formed over one substrate, whereby a light-emitting device which is capable of full-color display can be manufactured.

FIGS. 4A and 4B illustrate the example in which the openings 402 in the reflective layer formed over the evaporation donor substrate each have a rectangular shape. However, the present invention is not particularly limited to this example and stripe openings may be employed. In the case where the stripe openings are employed, although deposition is also performed between light-emitting regions for emitting light of the same color, a film is formed over the insulator 414, and thus a portion overlapping with the insulator 414 does not serve as a light-emitting region.

Figure 5A:
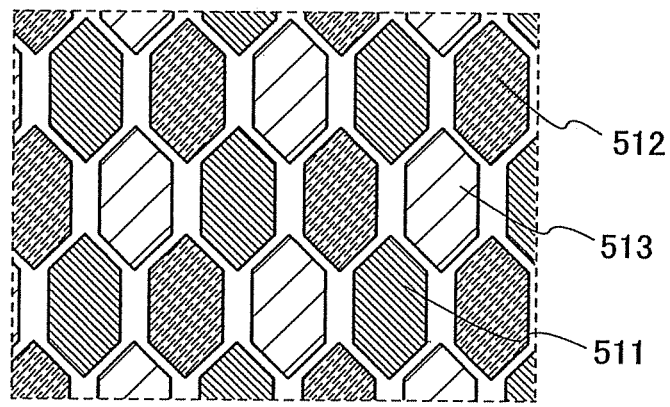
FIGS. 5A and 5B are views illustrating a deposition method of the present invention.
Figure 5B:
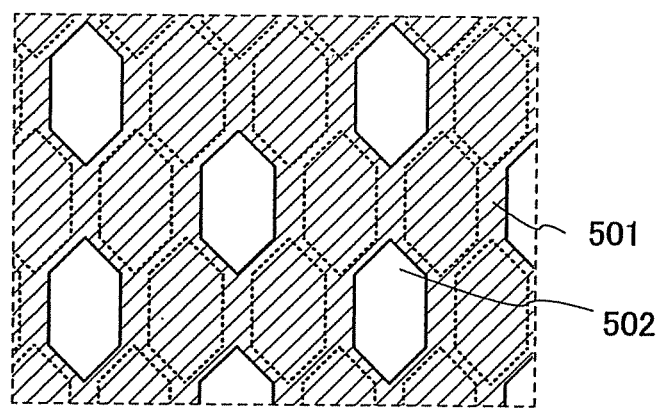

In addition, there is no particular limitation on the arrangement of pixels. The shape of each pixel may be a polygon, for example, a hexagon as illustrated in FIG. 5A, and a full-color light-emitting device may be realized by arrangement of an EL layer (R) 511, an EL layer (G) 512, and an EL layer (B) 513. In order to form polygonal pixels illustrated in FIG. 5A, deposition may be performed using an evaporation donor substrate which includes a reflective layer 501 having polygonal openings 502 illustrated in FIG. 5B.

In the manufacture of the light-emitting device which is capable of full-color display, which is described in Embodiment Mode 2, a predetermined position of the evaporation donor substrate used in this embodiment mode can be selectively irradiated with laser light at the time of evaporation using the laser light; thus, use efficiency of an evaporation material can be increased, a film which is flat and has no unevenness can be deposited, and a minute pattern can be formed. Therefore, manufacturing cost of a light-emitting device manufactured using the evaporation donor substrate described in this embodiment mode can be reduced and a light-emitting device having excellent characteristics can be obtained.

Note that the structure described in Embodiment Mode 2 can be combined with the structure described in Embodiment Mode 1 as appropriate.

[Embodiment Mode 3]

In Embodiment Mode 3, an example of a deposition apparatus which makes it possible to manufacture a light-emitting device of the present invention will be described.

Figure 7:
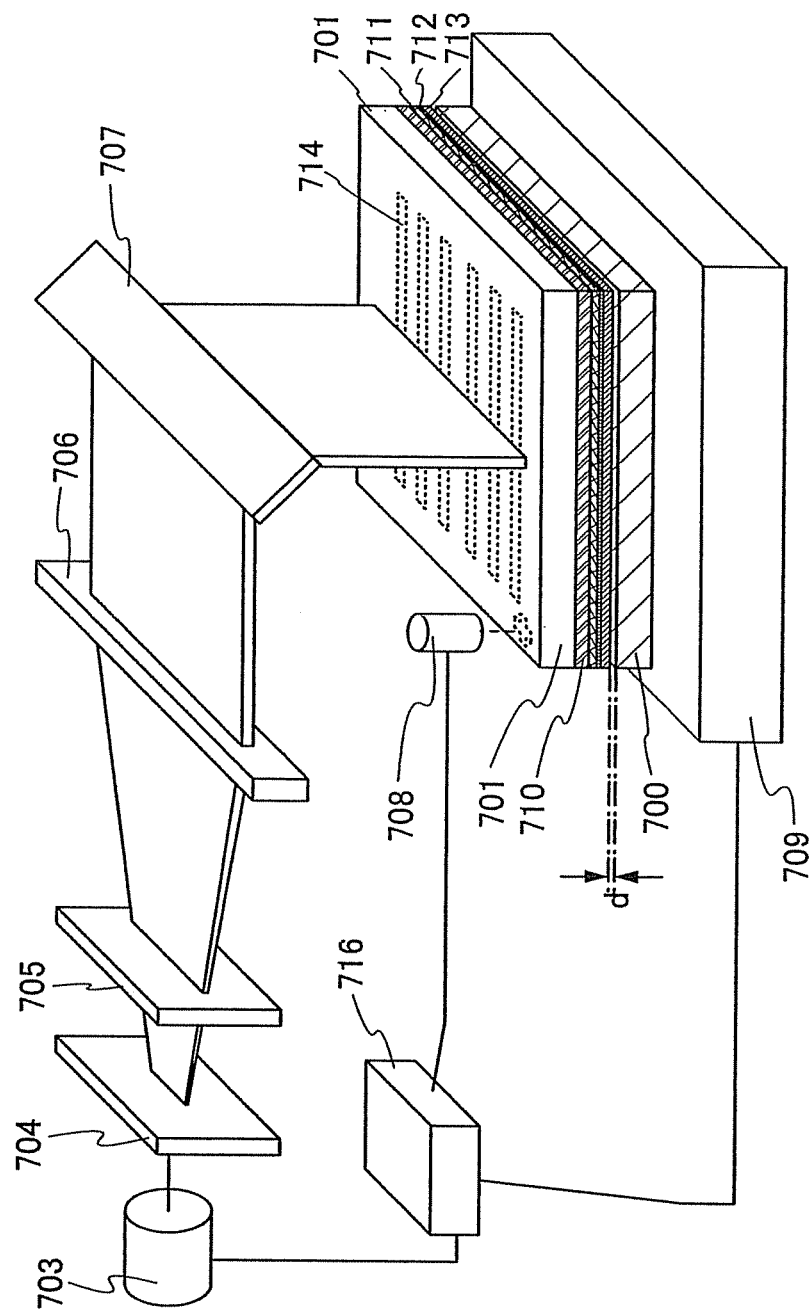
FIG. 7 is a view illustrating a deposition apparatus.

FIG. 7 is a perspective view illustrating an example of a deposition apparatus using a laser. Laser light is outputted from a laser device 703 (a YAG laser device, an excimer laser device, or the like) and transmitted through a first optical system 704 for changing the shape of a laser beam into a rectangular shape, a second optical system 705 for shaping the laser beam, and a third optical system 706 for collimating the beam, and an optical path is bent to a direction perpendicular to an evaporation donor substrate 701 with use of a reflecting mirror 707. Then, the evaporation donor substrate is irradiated with the laser beam.

Note that a structure of an evaporation donor substrate described in Embodiment Mode 3 is similar to that described with reference to FIG. 1A in Embodiment Mode 1. That is, the evaporation donor substrate has a structure in which a first layer 710 including the first function film 102, a second layer 711 including the reflective layer 103, the heat-insulating layer 104, and the second function film 105, a third layer 712 including the light-absorbing layer 106, and a fourth layer 713 including the material layer 107 are formed over a substrate. In addition, the reflective layer 103 and the heat-insulating layer 104 included in the second layer 711 have openings 714.

Laser light with a wavelength of greater than or equal to 400 nm and less than or equal to 600 nm is used as laser light which serves as a light source. For example, laser light having a wavelength of 488 nm, 514 nm, 527 nm, 532 nm, or 561 nm can be used. With use of laser light, thermal conversion in the light-absorbing layer 106 is performed efficiently, which leads to efficient sublimation of the evaporation material.

As the laser light, it is possible to use light oscillated from one or more of a gas laser such as an Ar laser, a Kr laser, or an excimer laser; a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, or a Ti:sapphire laser. Alternatively, a second harmonic or a third harmonic oscillated from the above-described solid-state laser can be used.

Further, the laser may be either a continuous-wave (CW) laser or a pulsed laser.

The shape of a laser spot with which the evaporation donor substrate 701 is irradiated is preferably linear or rectangular. Furthermore, in the case of using a large-area substrate, a laser spot preferably has a longer side of 20 cm to 100 cm in order to shorten processing time. Further, a plurality of laser devices and optical systems illustrated in FIG. 7 may be provided, whereby a large-area substrate is processed in a short time. Specifically, a laser beam may be emitted from each of the plurality of laser devices, whereby the area to be processed of one substrate is divided by the laser beams.

Note that FIG. 7 illustrates an example, and there is no particular limitation on positional relationship between each optical system and electro-optical element placed in the path of laser light. For example, a reflective mirror 707 is not necessarily used if the laser device 703 is placed above the evaporation donor substrate 701 so that laser light is emitted from the laser device 703 in a direction perpendicular to the principal plane of the evaporation donor substrate 701. Further, each optical system may employ a condenser lens, a beam expander, a homogenizer, a polarizer, or the like, and these may be combined. Further, as each optical system, slits may be combined.

A region to be irradiated is two-dimensionally scanned with a laser beam as appropriate, whereby a large area of the substrate is irradiated with the laser beam. For the scan, the region to be irradiated with a laser beam and the substrate are relatively moved. Here, the scan is performed with a moving means (not illustrated) which moves a substrate stage 709 holding the substrate in the X-Y direction.

Further, a control device 716 is preferably interlocked such that it can also control the moving means which moves the substrate stage 709 in the X-Y direction. Moreover, the control device 716 is preferably interlocked such that it can also control the laser device 703. Furthermore, the control device 716 is preferably interlocked with a position alignment mechanism which has an image pickup element 708 for recognizing a position marker. Note that the position alignment mechanism aligns the evaporation donor substrate 701 and a deposition target substrate 700.

Further, the distance d, which is the distance between the evaporation donor substrate 701 and the deposition target substrate 700, is defined as the distance between a surface of the material layer formed over the evaporation donor substrate 701 and a surface of the deposition target substrate 700.

In addition, in the case where some layer (e.g., a conductive layer which functions as an electrode or an insulating layer which functions as a partition wall) is formed over the deposition target substrate 700, the distance d is defined as the distance between the surface of the material layer on the evaporation donor substrate 701 and the surface of the layer formed over the deposition target substrate 700. Note that in the case where the surface of the material layer formed on the evaporation donor substrate 701, the surface of the deposition target substrate 700, or the surface of the layer formed over the deposition target substrate 700 has projections and depressions, the distance d is defined as the shortest distance between the surface of the material layer on the evaporation donor substrate 701 and the outermost surface of the deposition target substrate 700 or the layer formed over the deposition target substrate 700. Note that the distance d is greater than or equal to 0 mm and less than or equal to 2 mm, preferably greater than or equal to 0 mm and less than or equal to 0.05 mm, more preferably greater than or equal to 0 mm and less than or equal to 0.03 mm. In addition, in the case where the deposition target substrate 700 is provided with an insulator which serves as a partition wall, the insulator and the material layer 715 may be placed in contact with each other.

When deposition is performed with use of the deposition apparatus illustrated in FIG. 7, at least the evaporation donor substrate 701 and the deposition target substrate 700 are set in a vacuum chamber. Alternatively, all the components illustrated in FIG. 7 may be placed in a vacuum chamber.

Although FIG. 7 illustrates an example of the deposition apparatus employing a so-called face-up system in which a surface of the deposition target substrate 700, over which a film is to be deposited faces upward, a deposition apparatus employing a face-down system may be used. When the deposition target substrate 700 is a large-area substrate, a so-called vertical placement apparatus may also be employed in which a main plane of the deposition target substrate 700 is perpendicular to a horizontal plane in order to suppress distortion of the center of the substrate due to its own weight.

By provision of a cooling means which cools the deposition target substrate 700, a flexible substrate such as a plastic substrate can be used as the deposition target substrate 700.

Further, when a plurality of deposition apparatuses described in this embodiment mode are provided, a multi-chamber deposition apparatus can be obtained. Needless to say, a deposition apparatus of another deposition method can be combined therewith. Furthermore, a plurality of deposition apparatuses described in this embodiment mode can be arranged in series, whereby an in-line deposition apparatus can be obtained.

When a light-emitting device is manufactured using the deposition apparatus described in this embodiment mode, with use of the evaporation donor substrate of the present invention, a desired position of the evaporation donor substrate can be selectively irradiated with laser light at the time of evaporation; thus, use efficiency of an evaporation material can be increased, a film which is flat and has no unevenness can be deposited, and a minute pattern can be formed. Therefore, manufacturing cost of a light-emitting device manufactured using the evaporation donor substrate described in this embodiment mode can be reduced and a light-emitting device having excellent characteristics can be obtained.

Note that the structure described in Embodiment Mode 3 can be used in combination with any of the structures described in Embodiment Modes 1 and 2.

[Embodiment Mode 4]

In this embodiment mode, a method for manufacturing a light-emitting element and a light-emitting device by application of the present invention will be described.

Figure 8A:
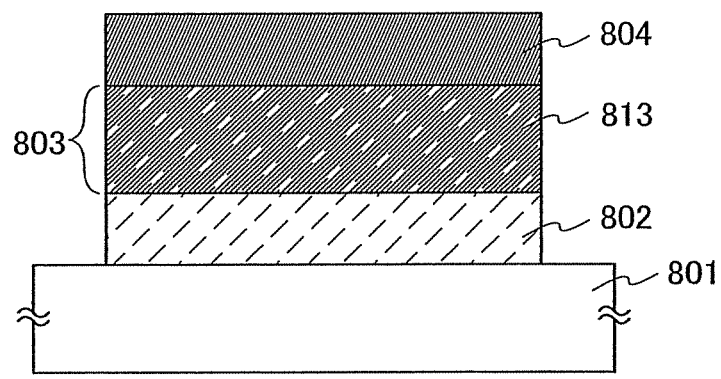
FIGS. 8A and 8B are views each illustrating a light-emitting element.
Figure 8B:
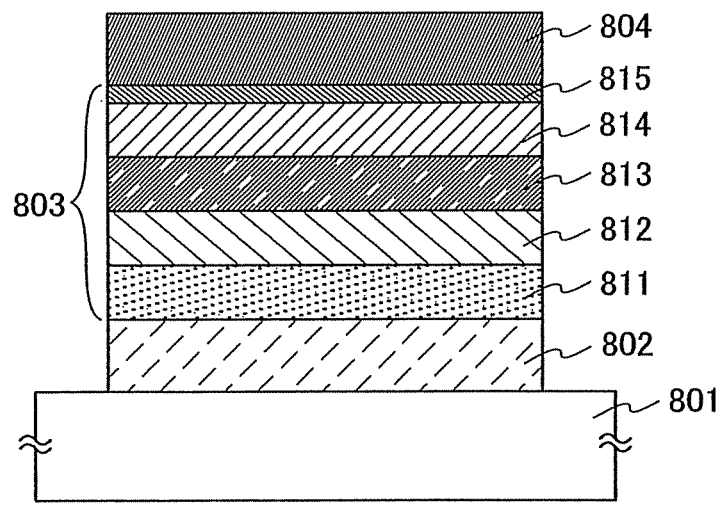

For example, light-emitting elements illustrated in FIGS. 8A and 8B can be manufactured. In the light-emitting element illustrated in FIG. 8A, a first electrode 802, an EL layer 803 which includes only a light-emitting layer 813, and a second electrode 804 are stacked in this order over a substrate 801. One of the first electrode 802 and the second electrode 804 functions as an anode, and the other functions as a cathode. Holes injected from an anode and electrons injected from a cathode are recombined in the EL layer 803, whereby light can be emitted. In this embodiment mode, the first electrode 802 functions as an anode and the second electrode 804 functions as a cathode.

In the light-emitting element illustrated in FIG. 8B, the EL layer 803 in FIG. 8A has a structure in which a plurality of layers are stacked. Specifically, a hole-injecting layer 811, a hole-transporting layer 812, the light-emitting layer 813, an electron-transporting layer 814, and an electron-injecting layer 815 are provided in this order from the first electrode 802 side. Note that the EL layer 803 functions by including at least the light-emitting layer 813 as illustrated in FIG. 8A; thus, not all the above-described layers are needed and the layer to be provided may be selected as appropriate.

As the substrate 801 illustrated in FIGS. 8A and 8B, a substrate having an insulating surface or an insulating substrate is employed. Specifically, any of various glass substrates used in the electronics industry, such as an aluminosilicate glass substrate, an aluminoborosilicate glass substrate, or a barium borosilicate glass substrate; a quartz substrate; a ceramic substrate; a sapphire substrate; and the like can be used.

For the first electrode 802 and the second electrode 804, any of various types of metals, alloys, electrically-conductive compounds, a mixture thereof, and the like can be used. Specifically, indium tin oxide (ITO), indium tin oxide containing silicon or silicon oxide, indium zinc oxide (IZO), indium oxide containing tungsten oxide and zinc oxide, and the like can be given, for example. Besides, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), and the like can be given.

These materials are generally formed by a sputtering method. For example, indium zinc oxide can be formed by a sputtering method using a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, by application of a sol-gel method or the like, an inkjet method, a spin coating method, or the like may be used for the formation.

Alternatively, aluminum (Al), silver (Ag), an alloy containing aluminum, or the like can be used. Alternatively, an element belonging to Group 1 or Group 2 of the periodic table, which has a low work function, that is, an alkali metal such as lithium (Li) or cesium (Cs), an alkaline earth metal such as magnesium (Mg), calcium (Ca), or strontium (Sr), and an alloy thereof (an alloy of aluminum, magnesium, and silver, and an alloy of aluminum and lithium); a rare earth metal such as europium (Eu) or ytterbium (Yb), and an alloy thereof; and the like.

A film of an alkali metal, an alkaline earth metal, or an alloy containing the metal can be formed by a vacuum evaporation method. Alternatively, a film of an alloy containing an alkali metal or an alkaline earth metal can be formed by a sputtering method. Further alternatively, a film can be formed using a silver paste or the like by an ink-jet method or the like. Each of the first electrode 802 and the second electrode 804 is not limited to a single-layer film and can be formed as a stacked-layer film.

Note that in order to extract light emitted from the EL layer 803 to the outside, one or both of the first electrode 802 and the second electrode 804 is/are formed so as to transmit light. For example, one or both of the first electrode 802 and the second electrode 804 is/are formed using a conductive material having a light-transmitting property, such as indium tin oxide, or formed using silver, aluminum, or the like to a thickness of several nanometers to several tens of nanometers. Alternatively, the first electrode 802 or the second electrode 804 can have a stacked-layer structure including a thin film of a metal such as silver or aluminum and a thin film of a conductive material having a light-transmitting property, such as ITO.

Note that the EL layer 803 (the hole-injecting layer 811, the hole-transporting layer 812, the light-emitting layer 813, the electron-transporting layer 814, or the electron-injecting layer 815) of the light-emitting element described in this embodiment mode can be formed by application of the deposition method described in Embodiment Mode 1. In addition, the electrode can also be formed by application of the deposition method described in Embodiment Mode 1.

For example, in the case where the light-emitting element illustrated in FIG. 8A is formed, a material layer of the evaporation donor substrate described in Embodiment Mode 1 is formed of a material which forms the EL layer 803, and the EL layer 803 is formed over the first electrode 802 over the substrate 801 using the evaporation donor substrate. Then, the second electrode 804 is formed over the EL layer 803, whereby the light-emitting element illustrated in FIG. 8A can be obtained.

Any of a variety of materials can be used for the light-emitting layer 813. For example, a fluorescent compound which emits fluorescence or a phosphorescent compound which emits phosphorescence can be used.

As a phosphorescent compound which can be used for the light-emitting layer 813, the following light-emitting material can be given. For example, as a light-emitting material for blue emission, there are bis[2-(4',6'-difluorophenyl)pyridinato-N,$C^{2'}$]iridium(III)tetrakis(1-pyrazolyl)borate (FIr6), bis[2-(4',6'-difluorophenyppyridinato-N,$C^{2'}$]iridium(III)picolinate (FIrpic), bis[2-(3',5'-bistrifluoromethylphenyl)pyridinato-N,$C^{2'}$]iridium(III)picolinate (Ir(CF$_3$ppy)$_2$(pic)), bis[2-(4',6'-difluorophenyppyridinato-N,$C^{2'}$]iridium(III) acetylacetonate (FIracac), and the like. As a light-emitting material for green emission, there are tris(2-phenylpyridinato-N,$C^{2'}$)iridium(III)(Ir(ppy)$_3$), bis(2-phenylpyridinato-N,$C^{2'}$)iridium(III)acetylacetonate (Ir(ppy)$_2$(acac)), bis(1,2-diphenyl-1H-benzimidazolato)iridium(III)acetylacetonate (Ir(pbi)$_2$(acac)), bis(benzo[h]quinolinato)iridium(III)acetylacetonate (Ir(bzq)$_2$(acac)), and the like. As a light-emitting material for yellow emission, there are bis(2,4-diphenyl-1,3-oxazolato-N,$C^{2'}$)iridium(III)acetylacetonate (Ir(dpo)$_2$(acac)), bis[2-(4'-(perfluorophenylphenyl)pyridinato]iridium(III)acetylacetonate (Ir(p-PF-ph)$_2$(acac)), bis(2-phenylbenzothiazolato-N,$C^{2'}$)iridium(III)acetylacetonate (Ir(bt)$_2$(acac)), and the like. As a light-emitting material for orange emission, there are tris(2-phenylquinolinato-N,$C^{2'}$)iridium(III)(Ir(pq)$_3$), bis(2-phenylquinolinato-N,$C^{2'}$)iridium(III)acetylacetonate (Ir(pq)$_2$(acac)), and the like. As a light-emitting material for red emission, there are organic metal complexes such as bis[2-(2'-benzo[4,5-α]thienyl)pyridinato-N,$C^{3'}$)iridium(III)acetylacetonate (Ir(btp)$_2$(acac)), bis(1-phenylisoquinolinato-N,$C^{2'}$)iridium(III)acetylacetonate (Ir(piq)$_2$(acac), (acetylacetonato)bis[2,3-bis(4-fluorophenyl) quinoxalinato]iridium(III) (Ir(Fdpq)$_2$(acac)), and 2,3,7,8,12,13,17,18-octaethyl-21H,23H-porphine platinum(II) (PtOEP). In addition, rare earth metal complexes such as tris(acetylacetonato)(monophenanthroline)terbium(III) (Tb(acac)$_3$(Phen)), tris(1,3-diphenyl-1,3-propanedionato)(monophenanthroline)europium(III) (Eu(DBM)$_3$(Phen)), and tris[1-(2-thenoyl)-3,3,3-trifluoroacetonato] (monophenanthroline)europium(III) (Eu(TTA)$_3$(Phen)) perform light emission from a rare earth metal ion (electron transition between different multiplicities); therefore, such rare earth metal complexes can be used as phosphorescent compounds.

As a fluorescent compound which can be used for the light-emitting layer 813, the following light-emitting material can be given. For example, as a light-emitting material for blue emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like. As a light-emitting material for green emission, there are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)]-N-[4-(9H-carbazol-9-yl)phenyl]-N-phenylanthracen-2-amine (2YGABPhA), N,N,9-triphenylanthracen-9-amine (DPhAPhA), and the like. As a light-emitting material for yellow emission, there are rubrene, 5,12-bis(1,1'-biphenyl-4-yl)-6,11-diphenyltetracene (BPT), and the like. As a light-emitting material for red emission, there are N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like.

Alternatively, the light-emitting layer 813 can have a structure in which a substance having a high light-emitting property (a dopant material) is dispersed in another substance (a host material). The use of the structure in which a substance having a high light-emitting property (a dopant material) is dispersed in another substance (a host material) makes it possible to suppress crystallization of the light-emitting layer. Moreover, concentration quenching due to high concentration of a substance having a high light-emitting property can be suppressed.

As the substance in which a substance having a high light-emitting property is dispersed, in the case where the substance having a high light-emitting property is a fluorescent compound, a substance having singlet excitation energy (the energy difference between a ground state and a singlet excited state) which is higher than the fluorescent compound is preferably used. In addition, in the case where the substance having a high light-emitting property is a phosphorescent compound, a substance having triplet excitation energy (the energy difference between a ground state and a triplet excited state) which is higher than the phosphorescent compound is preferably used.

As the host material used for the light-emitting layer 813, for example, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III)

(Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III)(BAlq), and the like.

As the dopant material, any of the above-described phosphorescent compounds or fluorescent compounds can be used.

In the case where the light-emitting layer 813 has a structure in which a substance having a high light-emitting property (a dopant material) is dispersed in another substance (a host material), a mixed layer of a host material and a guest material is formed as the material layer over the evaporation donor substrate. Alternatively, the material layer over the evaporation donor substrate may have a structure in which a layer containing a host material and a layer containing a dopant material are stacked. Formation of the light-emitting layer 813 by use of an evaporation donor substrate with the material layer having such a structure, the light-emitting layer 813 contains a substance in which a light-emitting material is dispersed (a host material) and a substance having a high light-emitting property (a dopant material), and has a structure in which the substance having a high light-emitting property (a dopant material) is dispersed in the substance in which a light-emitting material is dispersed (a host material). Note that for the light-emitting layer 813, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 8B is formed, the evaporation donor substrate described in Embodiment Mode 1 which has a material layer formed of a material for forming each layer in the EL layer 803 (the hole-injecting layer 811, the hole-transporting layer 812, the electron-transporting layer 814, and the electron-injecting layer 815) is prepared for each layer, and deposition of each layer is performed using a different evaporation donor substrate by the method described in Embodiment Mode 1, whereby the EL layer 803 is formed over the first electrode 802 over the substrate 801. Then, the second electrode 804 is formed over the EL layer 803; thus, the light-emitting element illustrated in FIG. 8B can be obtained. Note that although all the layers in the EL layer 803 can be formed by the method described in Embodiment Mode 1 in this case, only some of the layers in the EL layer 803 may be formed by the method described in Embodiment Mode 1.

For example, the hole-injecting layer 811 can be formed using molybdenum oxide, vanadium oxide, ruthenium oxide, tungsten oxide, manganese oxide, or the like. Alternatively, the hole-injecting layer 811 can be formed using a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like.

As the hole-injecting layer 811, a layer which contains a substance having a high hole-transporting property and a substance having an electron-accepting property can be used. The layer which contains a substance having a high hole-transporting property and a substance having an electron-accepting property has high carrier density and an excellent hole-injecting property. The layer which contains a substance having a high hole-transporting property and a substance having an electron-accepting property is used as a hole-injecting layer which is in contact with an electrode which functions as an anode, whereby any of various kinds of metals, alloys, electrically-conductive compounds, a mixture thereof, and the like can be used for the electrode regardless of the magnitude of work function of a material of the electrode which functions as an anode.

The layer which contains a substance having a high hole-transporting property and a substance having an electron-accepting property can be formed using, for example, an evaporation donor substrate having a material layer in which a layer containing a substance having a high hole-transporting property and a layer containing a substance having an electron-accepting property are stacked.

As the substance having an electron-accepting property, which is used for the hole-injecting layer 811, 7,7,8,8-tetracyano-2,3,5,6-tetrafluoroquinodimethane (F4-TCNQ), chloranil, and the like can be given. In addition, a transition metal oxide can be given. Moreover, oxides of metals belonging to Group 4 to Group 8 can be given. Specifically, vanadium oxide, niobium oxide, tantalum oxide, chromium oxide, molybdenum oxide, tungsten oxide, manganese oxide, and rhenium oxide are preferable because of their high electron-accepting properties. Above all, molybdenum oxide is particularly preferable because it is stable even in the atmospheric air, has a low hygroscopic property, and is easy to be handled.

As the substance having a high hole-transporting property used for the hole-injecting layer 811, any of various compounds such as an aromatic amine compound, a carbazole derivative, an aromatic hydrocarbon, and a high molecular compound (such as oligomer, dendrimer, and polymer) can be used. Note that it is preferable that the substance having a high hole-transporting property used for the hole-injecting layer be a substance having a hole mobility of greater than or equal to $10^{-6}$ cm$^2$/Vs. However, substances other than those may be used as long as the hole-transporting properties thereof are higher than the electron-transporting properties thereof. Specific examples of the substance having a high hole-transporting property, which can be used for the hole-injecting layer 811, are given below.

As the aromatic amine compound which can be used for the hole-injecting layer 811, for example, the following can be used: 4,4'-bis[N-(1-naphthyl)-N-phenylamino]biphenyl (NPB), N,N-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), or the like. In addition, the following can be given: N,N'-bis(4-methylphenyl)(p-tolyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

As the carbazole derivative which can be used for the hole-injecting layer 811, the following can be specifically given: 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, as the carbazole derivative which can be used for the hole-injecting layer 811, the following can be given: 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

As the aromatic hydrocarbon which can be used for the hole-injecting layer 811, the following can be given, for example: 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, and the like can also be used. As described above, an aromatic hydrocarbon having a hole mobility of greater than or equal to $1 \times 10^{-6}$ cm$^2$/Vs and having 14 to 42 carbon atoms is preferably used.

The aromatic hydrocarbon which can be used for the hole-injecting layer 811 may have a vinyl skeleton. As the aromatic hydrocarbon which has a vinyl skeleton, for example, 4,4'-bis(2,2-diphenylvinyl)biphenyl (DPVBi), 9,10-bis[4-(2,2-diphenylvinyl)phenyl]anthracene (DPVPA), and the like can be given.

The hole-injecting layer 811 can be formed using an evaporation donor substrate having a material layer in which a layer containing the above-described substance having a high hole-transporting property and a layer containing the above-described substance having an electron-accepting property are stacked. In the case of using metal oxide as the substance having an electron-accepting property, it is preferable that a layer containing metal oxide be formed after forming the layer containing a substance having a high hole-transporting property over the first substrate 801. This is because, in many cases, the decomposition temperature or the evaporation temperature of metal oxide is higher than that of a substance having a high hole-transporting property. The evaporation source with such a structure makes it possible to efficiently sublime a substance having a high hole-transporting property and metal oxide. In addition, local non-uniformity of the concentration in a film formed by evaporation can be suppressed. Moreover, there are few kinds of solvents which allow both a substance having a high hole-transporting property and metal oxide to be dissolved or dispersed therein, and a mixed solution is not easily formed. Therefore, it is difficult to directly form a mixed layer by a wet method. However, the use of the deposition method of the present invention makes it possible to easily form a mixed layer which contains a substance having a high hole-transporting property and metal oxide.

Moreover, the layer which contains a substance having a high hole-transporting property and a substance having an electron-accepting property has not only an excellent hole-injecting property but also an excellent hole-transporting property; thus, the above-described hole-injecting layer 811 may be used as a hole-transporting layer.

The hole-transporting layer 812 contains a substance having a high hole-transporting property. As the substance having a high hole-transporting property, for example, an aromatic amine compound such as 4,4-c-bis[N-(1-naphthyl)-N-phenylamino]biphenyl (NPB or α-NPD), N,N-bis(3-methylphenyl)-N,N-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino] triphenylamine (MTDATA), or 4,4'-bis[N-(Spiro-9,9'-bifluoren-2-yl)-N-phenylamino]biphenyl (BSPB), or the like can be used. The substances described here are mainly substances having a hole mobility of greater than or equal to $10^{-6}$ cm$^2$/Vs. However, substances other than those may be used as long as the hole-transporting properties thereof are higher than the electron-transporting properties thereof. Note that the layer which contains a substance having a high hole-transporting property is not limited to a single layer, but two or more layers each of which is formed of the above-described substance may be stacked.

The electron-transporting layer 814 contains a substance having a high electron-transporting property. As the substance having a high electron-transporting property, for example, a metal complex having a quinoline skeleton or a benzoquinoline skeleton, such as tris(8-quinolinolato)aluminum (Alq); tris(4-methyl-8-quinolinolato)aluminum (Almq$_3$); bis(10-hydroxybenzo[h]quinolinato)beryllium (BeBq$_2$), or bis(2-methyl-8-quinolinolato)(4-phenylphenolato)aluminum (BAlq) can be used. Alternatively, a metal complex having an oxazole-based ligand or a thiazole-based ligand, such as bis[2-(2-hydroxyphenyl)benzoxazolato]zinc (Zn(BOX)$_2$) or bis[2-(2-hydroxyphenyl)benzothiazolato]zinc (Zn(BTZ)$_2$) can be used. Further alternatively, besides the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), or the like can be used. The substances described here are mainly substances having an electron mobility of greater than or equal to $10^{-6}$ cm$^2$Ns. Note that substances other than those may be used as long as the electron-transporting properties thereof are higher than the hole-transporting properties thereof. In addition, the electron-transporting layer is not limited to a single layer, but two or more layers each of which is formed of the above-described substance may be stacked.

As the electron-injecting layer 815, a compound of an alkali metal or an alkaline earth metal such as lithium fluoride (LiF), cesium fluoride (CsF), or calcium fluoride (CaF$_2$) can be used. Alternatively, a layer in which a substance having an electron-transporting property is combined with an alkali metal or an alkaline earth metal can be used. For example, a layer made of Alq in which magnesium (Mg) is contained can be used. Note that it is preferable that the layer in which a substance having an electron-transporting property is combined with an alkali metal or an alkaline earth metal be used as the electron-injecting layer 815 because electrons are efficiently injected from the second electrode 804.

Note that there is no particular limitation on a stacked-layer structure of the EL layer 803. The EL layer 803 may be formed by an appropriate combination of a light-emitting layer with any of layers which contain a substance having a high electron-transporting property, a substance having a high hole-transporting property, a substance having a high electron-injecting property, a substance having a high hole-injecting property, a bipolar substance (a substance having a high electron-transporting property and a high hole-transporting property), and the like.

Light emission from the EL layer 803 is extracted to the outside through one or both of the first electrode 802 and the second electrode 804. Therefore, one of or both the first electrode 802 and the second electrode 804 is/are an electrode having a light-transmitting property. When only the first electrode 802 is an electrode having a light-transmitting property, light is extracted from the substrate 801 side through the first electrode 802. When only the second electrode 804 is an electrode having a light-transmitting property, light is extracted from a side opposite to the substrate 801 through the second electrode 804. When both the first electrode 802 and the second electrode 804 are electrodes having light-transmitting properties, light is extracted from both the substrate 801 side and the side opposite thereto through the first electrode 802 and the second electrode 804, respectively.

Although FIGS. 8A and 8B illustrate the structure in which the first electrode 802 which functions as an anode is provided on the substrate 801 side, the second electrode 804 which functions as a cathode may be provided on the substrate 801 side.

The EL layer 803 is formed by the deposition method described in Embodiment Mode 1 or may be formed by a combination of the deposition method described in Embodiment Mode 1 with another deposition method. In addition, a different deposition method may be used for each layer. As a dry method, a vacuum evaporation method, an electron beam evaporation method, a sputtering method, and the like are given. As a wet method, an ink-jet method, a spin coating method, and the like are given.

In a light-emitting element according to Embodiment Mode 4, an EL layer to which the present invention is applied can be formed. Accordingly, a highly accurate film can be formed efficiently. Therefore, not only improvement in characteristics of the light-emitting element, but also improvement in yield and reduction in cost can be achieved.

Note that the structure described in Embodiment Mode 4 can be combined with a structure in any of Embodiment Modes 1 to 3 as appropriate.

[Embodiment Mode 5]

In Embodiment Mode 5, a light-emitting device which is formed using the light-emitting element described in Embodiment Mode 4 will be described.

First, a passive-matrix light-emitting device will be described with reference to FIGS. 9A to 9C and FIG. 10.

In a passive-matrix (also referred to as "simple-matrix") light-emitting device, a plurality of anodes arranged in stripes (in strip form) are provided to be perpendicular to a plurality of cathodes arranged in stripes, and a light-emitting layer is interposed at each intersection. Therefore, a pixel at an intersection portion of an anode which is selected (to which voltage is applied) and a cathode which is selected emits light.

Figure 9A:
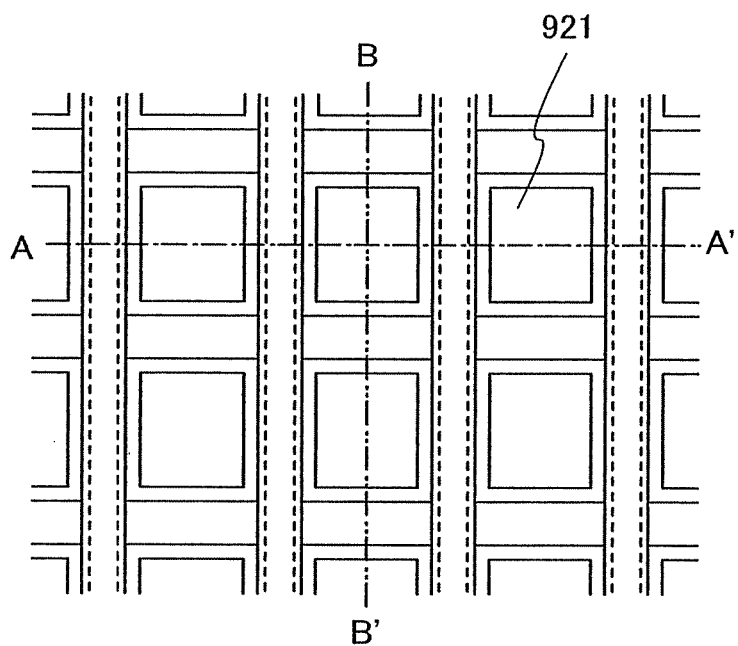
FIGS. 9A to 9C are views illustrating a passive matrix light-emitting device.
Figure 9C:
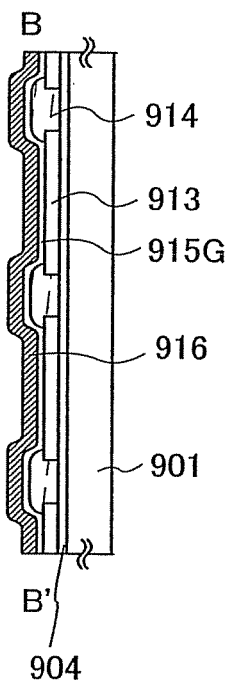
Figure 9B:
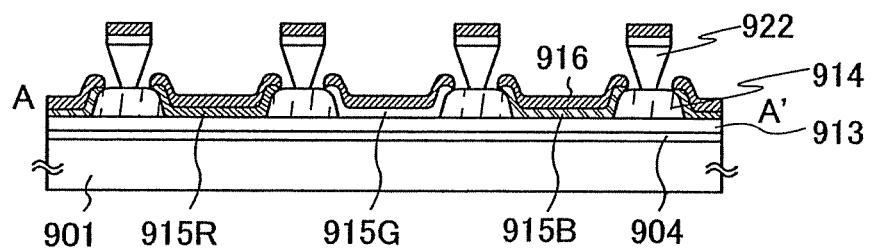

FIG. 9A is a top-plan view of a pixel portion before sealing. FIG. 9B is a cross-sectional view taken along a dashed line A-A' in FIG. 9A. FIG. 9C is a cross-sectional view taken along a dashed line B-B' in FIG. 9A.

Over a substrate 901, an insulating layer 904 is formed as a base insulating layer. Note that the base insulating layer is not necessarily formed if not necessary. Over the insulating layer 904, a plurality of first electrodes 913 are arranged in stripes at regular intervals. A partition wall 914 having openings each corresponding to a pixel is provided over the first electrodes 913. The partition wall 914 having openings is formed using an insulating material (a photosensitive or a nonphotosensitive organic material (e.g., polyimide, acrylic, polyamide, polyimide amide, resist, or benzocyclobutene) or an SOG film (e.g., an SiOx film containing an alkyl group)). Note that the openings each corresponding to a pixel serve as light-emitting regions 921.

Over the partition wall 914 having openings, a plurality of inversely-tapered partition walls 922 parallel to each other are provided to intersect with the first electrodes 913. The inversely-tapered partition walls 922 are formed by a photolithography method using a positive-type photosensitive resin of which a portion unexposed to light remains as a pattern, and by adjustment of the amount of light exposure or the length of development time so that a lower part of a pattern is etched more.

The total thickness of the partition wall 914 having openings and the inversely-tapered partition wall 922 is set to be larger than the total thickness of an EL layer and a second electrode 916. Accordingly, an EL layer which is divided into plural regions, specifically, an EL layer (R) (915R) formed of a material for red emission, an EL layer (G) (915G) formed of a material for green emission, and an EL layer (B) (915B) formed of a material for blue emission; and the second electrodes 916 are formed. Note that the plurality of divided regions are electrically isolated from one another.

The second electrodes 916 are electrodes in stripes, which are parallel to one another and extend along a direction intersecting with the first electrodes 913. Note that a plurality of stacked-layers each including the EL layer and a part of conductive layer forming the second electrode 916 are also formed over the inversely-tapered partition walls 922; however, they are separated from the EL layer (R) (915R), the EL layer (G) (915G), the EL layer (B) (915B), and the second electrodes 916. Note that the EL layer in this embodiment mode is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (915R), the EL layer (G) (915G), and the EL layer (B) (915B) are selectively formed to manufacture a light-emitting device which provides three kinds of light emission (red (R), green (G), blue (B)) and is capable of performing full color display. Note that the EL layer (R) (915R), the EL layer (G) (915G), and the EL layer (B) (915B) are formed into stripes parallel to one another. These EL layers may be formed by the deposition methods described in Embodiment Modes 1 and 2.

Further, the light-emitting device is sealed using a sealant such as a sealing can or a glass substrate for sealing, if necessary. Here, a glass substrate is used as a sealing substrate, and a substrate and the sealing substrate are attached to each other with use of an adhesive such as a sealing material to seal a space surrounded by the adhesive such as a sealing material. The space which is hermetically sealed is filled with a filler or a dried inert gas. In addition, a desiccant or the like may be put between the substrate and the sealant so that reliability of the light-emitting device is increased. The desiccant removes a minute amount of moisture, whereby sufficient desiccation is performed. For the desiccant agent, a substance which adsorbs moisture by chemical adsorption, such as oxide of alkaline earth metal such as calcium oxide or barium oxide can be used. Note that a substance which adsorbs moisture by physical adsorption, such as zeolite or silica gel may be used alternatively.

Note that the desiccant is not necessarily provided if the sealant which covers and is contact with the light-emitting element is provided to sufficiently block the outside air.

Figure 10:
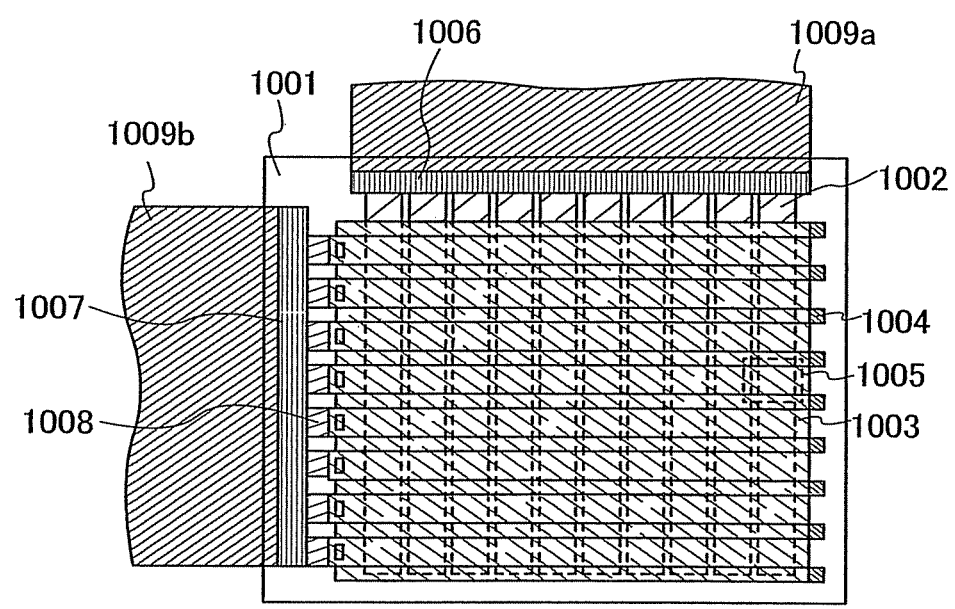
FIG. 10 is a view illustrating a passive matrix light-emitting device.

Next, FIG. 10 is a top view of the case where the passive-matrix light-emitting device illustrated in FIGS. 9A to 9C is mounted with an FPC or the like.

As illustrated in FIG. 10, in a pixel portion forming an image display, which is formed over a substrate 1001, scanning lines and data lines are arranged to intersect with each other so that the scanning lines and the data lines are perpendicular to each other.

Here, the first electrodes 913 in FIGS. 9A to 9C correspond to scanning lines 1003 in FIG. 10; the second electrodes 916 in FIGS. 9A to 9C correspond to data lines 1002 in FIG. 10; and the inversely-tapered partition walls 922 correspond to partition walls 1004. EL layers are sandwiched between the data lines 1002 and the scanning lines 1003, and an intersection portion indicated by a region 1005 corresponds to one pixel.

Note that the scanning lines 1003 are electrically connected at their ends to connecting wirings 1008, and the connecting wirings 1008 are connected to an FPC 1009b via an input terminal 1007. The data lines 1002 are connected to an FPC 1009a via an input terminal 1006.

If necessary, a polarizing plate, a circularly polarizing plate (including an elliptically polarizing plate in its category), a retardation plate (a quarter-wave plate or a half-wave plate), or an optical film such as a color filter may be provided as appropriate over a light-emitting surface. Further, a polarizing plate or a circularly polarizing plate may be provided with an anti-reflection film. For example, anti-glare treatment can be performed, by which reflected light can be diffused by projections and depressions of a surface, thereby reducing reflection.

Although FIG. 10 illustrates the example in which a driver circuit is not provided over the substrate, the present invention is not particularly limited to this example. An IC chip including a driver circuit may be mounted on the substrate.

In the case where an IC chip is mounted, a data line side IC and a scanning line side IC, in each of which a driver circuit for transmitting a signal to the pixel portion is formed, are mounted on the periphery of (outside of) the pixel portion by a COG method. The mounting may be performed using TCP or a wire bonding method other than the COG method. TCP is a method in which an IC is mounted onto a TAB tape, where a TAB tape is connected to a wiring on an element formation substrate and an IC is mounted onto the TAB tape. Each of the data line side IC and the scanning line side IC may be formed using a silicon substrate, or may be formed by formation of a driver circuit with a TFT over a glass substrate, a quartz substrate, or a plastic substrate. Although described here is an example in which a single IC is provided on one side, a plurality of divided ICs may be provided on one side.

Next, an example of an active-matrix light-emitting device is described with reference to FIGS. 11A and 11B. Note that FIG. 11A is a top view illustrating a light-emitting device and FIG. 11B is a cross-sectional view taken along a chain line A-A' in FIG. 11A. The active matrix light-emitting device according to this embodiment mode includes a pixel portion 1102 provided over an element substrate 1110, a driver circuit portion (a source side driver circuit) 1101, and a driver circuit portion (a gate side driver circuit) 1103. The pixel portion 1102, the driver circuit portion 1101, and the driver circuit portion 1103 are sealed, with a sealing material 1105, between the element substrate 1110 and a sealing substrate 1104.

In addition, over the element substrate 1110, a lead wiring 1108 for connecting an external input terminal which transmits a signal (e.g., a video signal, a clock signal, a start signal, or a reset signal) or an electric potential to the driver circuit portion 1101 and the driver circuit portion 1103 is provided. Here, an example is described in which a flexible printed circuit (FPC) 1109 is provided as the external input terminal. Note that, although only the FPC is illustrated here, this FPC may be provided with a printed wiring board (PWB). The light-emitting device in this specification refers to not only a light-emitting device itself but also a light-emitting device provided with an FPC or a PWB.

Next, a cross-sectional structure thereof is described with reference to FIG. 11B. The driver circuit portions and the pixel portion are formed over the element substrate 1110; however, the pixel portion 1102 and the driver circuit portion 1101 which is the source-side driver circuit are illustrated in FIG. 11B.

An example is illustrated in which a CMOS circuit which is the combination of an n-channel TFT 1123 and a p-channel TFT 1124 is formed in the driver circuit portion 1101. Note that a circuit included in the driver circuit portion may be formed of various CMOS circuits, PMOS circuits, or NMOS circuits. Although a driver integrated type in which the driver circuit is formed over the substrate is described in this embodiment mode, the driver circuit may not necessarily be formed over the substrate, and the driver circuit can be formed outside, not over the substrate.

The pixel portion 1102 includes a plurality of pixels, each of which includes a switching TFT 1111, a current-controlling TFT 1112, and a first electrode 1113 which is electrically connected to a wiring (a source electrode or a drain electrode) of the current-controlling TFT 1112. Note that an insulator 1114 is formed so as to cover an end portion of the first electrode 1113. In this embodiment mode, the insulator 1114 is formed using a positive photosensitive acrylic resin.

The insulator 1114 is preferably formed so as to have a curved surface with curvature at an upper end portion or a lower end portion thereof in order to obtain favorable coverage by a film which is to be stacked over the insulator 1114. For example, in the case of using a positive photosensitive acrylic resin as a material for the insulator 1114, the insulator 1114 is preferably formed so as to have a curved surface with a curvature radius (0.2 μm to 3 μm) at the upper end portion thereof. Either a negative photosensitive material which becomes insoluble in an etchant by light irradiation or a positive photosensitive material which becomes soluble in an etchant by light irradiation can be used for the insulator 1114. As the insulator 1114, without limitation to an organic compound, either an organic compound or an inorganic compound such as silicon oxide or silicon oxynitride can be used.

An EL layer 1100 and a second electrode 1116 are stacked over the first electrode 1113. Note that when an ITO film is used as the first electrode 1113, and a stacked film of a titanium nitride film and a film containing aluminum as its main component or a stacked film of a titanium nitride film, a film containing aluminum as its main component, and a titanium nitride film is used as a wiring of the current-controlling TFT 1112 which is connected to the first electrode 1113, resistance of the wiring is low and favorable ohmic contact with the ITO film can be obtained. Note that, although not illustrated here, the second electrode 1116 is electrically connected to the FPC 1109 which is an external input terminal.

In the EL layer 1100, at least the light-emitting layer is provided, and in addition to the light-emitting layer, a hole-injecting layer, a hole-transporting layer, an electron-transporting layer, or an electron-injecting layer is provided as appropriate. The first electrode 1113, the EL layer 1100, and the second electrode 1116 are stacked, whereby a light-emitting element 1115 is formed.

In addition, although the cross-sectional view of FIG. 11B illustrates only one light-emitting element 1115, a plurality of light-emitting elements are arranged in matrix in the pixel portion 1102. Light-emitting elements which provide three kinds of light emissions (R, G, and B) are selectively formed in the pixel portion 1102, whereby a light-emitting device which is capable of full color display can be manufactured. Alternatively, a light-emitting device which is capable of full color display may be manufactured by a combination with color filters.

Furthermore, the sealing substrate 1104 and the element substrate 1110 are attached to each other with the sealing material 1105, whereby the light-emitting element 1115 is provided in a space 1107 surrounded by the element substrate 1110, the sealing substrate 1104, and the sealing material 1105. Note that there is also a case where the space 1107 is filled with the sealing material 1105 as well as an inert gas (such as nitrogen or argon).

Note that an epoxy resin is preferably used for the sealing material 1105. Further, it is preferable that the material transmits as little moisture or oxygen as possible. As the sealing substrate 1104, a plastic substrate formed of FRP (fiberglass-reinforced plastics), PVF (polyvinyl fluoride), a polyester film, polyester, acrylic, or the like can be used instead of a glass substrate or a quartz substrate.

As described above, the light-emitting device can be obtained by application of the present invention. Since TFTs are manufactured in an active matrix light-emitting device, manufacturing cost per light-emitting device tends to be high; however, applying the present invention makes it possible to drastically reduce loss of materials at the time of formation of light-emitting elements. Thus, reduction in manufacturing cost can be achieved.

Application of the present invention makes it possible to easily form an EL layer included in a light-emitting element and also to easily manufacture a light-emitting device including the light-emitting element. In addition, a film which is flat and has no unevenness and a minute pattern can be formed; thus, a high-definition light-emitting device can be obtained. Moreover, since a desired position can be selectively irradiated with laser light at the time of evaporation using laser light, use efficiency of an evaporation material can be increased, which can lead to reduction in manufacturing cost.

Note that a structure described in Embodiment Mode 5 can be combined with a structure in any of Embodiment Modes 1 to 4 as appropriate.

[Embodiment Mode 6]

In this embodiment mode, various electronic devices each of which is completed using a light-emitting device manufactured by application of the present invention will be described with reference to FIGS. 12A to 12E.

As examples of electronic devices to which the light-emitting device according to the present invention is applied, there are televisions, cameras such as video cameras or digital cameras, goggle type displays (head-mounted displays), navigation systems, audio reproduction devices (e.g., car audio systems and audio systems), laptop computers, game machines, portable information terminals (e.g., mobile computers, cellular phones, portable game machines, and e-book readers), image reproduction devices in which a recording medium is provided (devices which are capable of reproducing recording media such as digital versatile discs (DVDs) and equipped with a display device which can display the image), lighting equipment, and the like. Specific examples of these electronic devices are illustrated in FIGS. 12A to 12E.

Figure 12A:
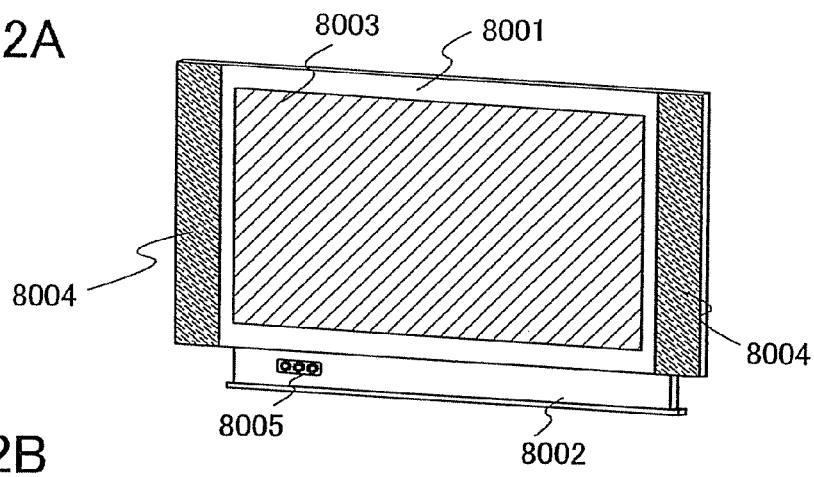
FIGS. 12A to 12E are views illustrating electronic devices.

FIG. 12A illustrates a display device, which includes a housing 8001, a supporting base 8002, a display portion 8003, a speaker portion 8004, video input terminals 8005, and the like. The display device is manufactured using a light-emitting device, which is formed according to the present invention, in the display portion 8003. Note that the display device includes all devices for displaying information in its category, for example, devices for personal computers, for receiving TV broadcasting, and for displaying an advertisement. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a display device; thus, an inexpensive display device can be provided.

Figure 12B:
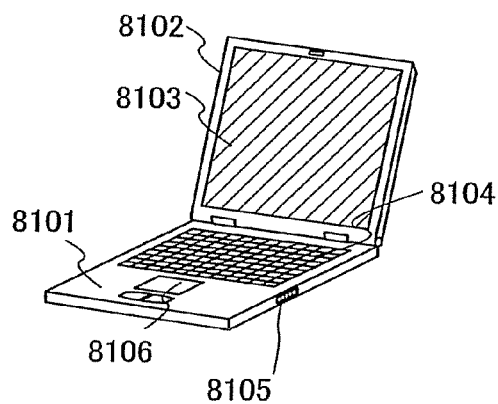

FIG. 12B illustrates a computer, which includes a main body 8101, a housing 8102, a display portion 8103, a keyboard 8104, an external connecting port 8105, a mouse 8106, and the like. The computer is manufactured using a light-emitting device, which is formed according to the present invention, in the display portion 8103. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a computer; thus, an inexpensive computer can be provided.

Figure 12C:
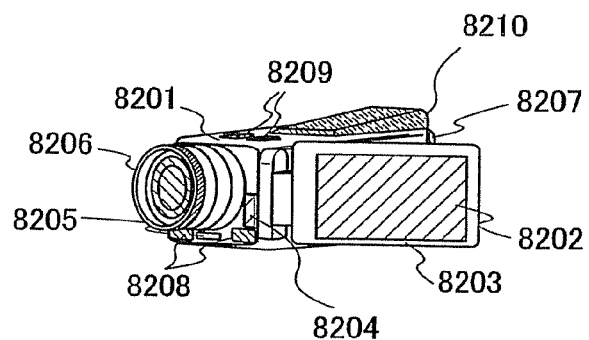

FIG. 12C illustrates a video camera, which includes a main body 8201, a display portion 8202, a housing 8203, an external connection port 8204, a remote control receiving portion 8205, an image receiving portion 8206, a battery 8207, an audio input portion 8208, operation keys 8209, an eyepiece portion 8210, and the like. The video camera is manufactured using a light-emitting device, which is formed according to the present invention, in the display portion 8202. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a video camera; thus, an inexpensive video camera can be provided.

Figure 12D:
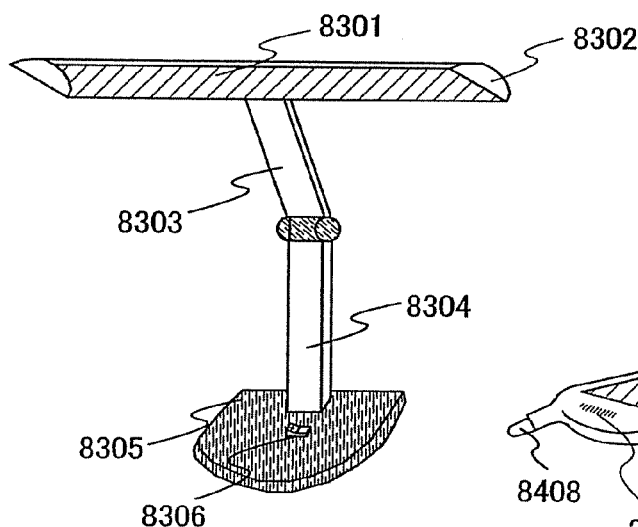

FIG. 12D illustrates desk lighting equipment, which includes a lighting portion 8301, a shade 8302, an adjustable arm 8303, a support 8304, a base 8305, and a power supply 8306. The desk lighting equipment is manufactured using a light-emitting device, which is formed according to the present invention, in the lighting portion 8301. Note that the lighting equipment includes a ceiling light, a wall light, and the like in its category. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing desk lighting equipment; thus, an inexpensive desk lighting equipment can be provided.

Figure 12E:
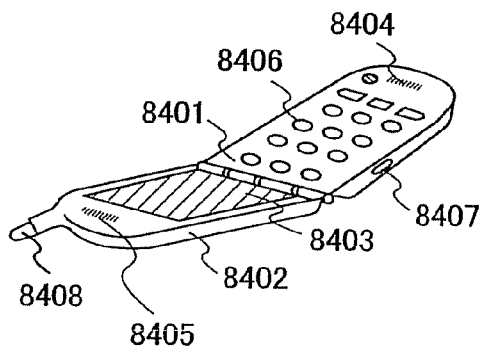

FIG. 12E illustrates a cellular phone, which includes a main body 8401, a housing 8402, a display portion 8403, an audio input portion 8404, an audio output portion 8405, operation keys 8406, an external connection port 8407, an antenna 8408, and the like. The cellular phone is manufactured using a light-emitting device, which is formed according to the present invention, in the display portion 8403. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a cellular phone; thus, an inexpensive cellular phone can be provided.

Figure 13A:
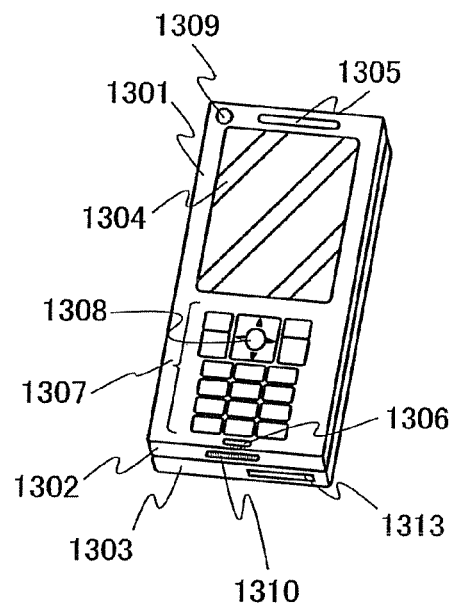
FIGS. 13A to 13C are views illustrating electronic devices.
Figure 13B:
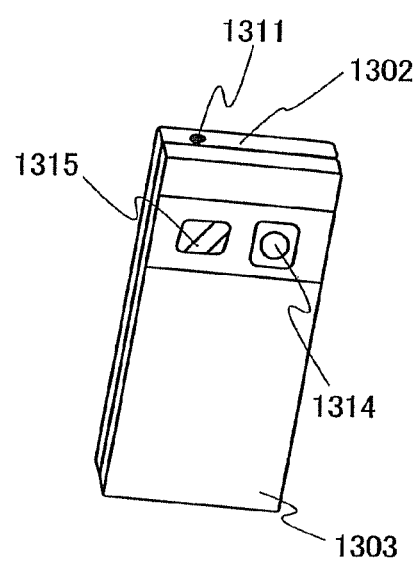
Figure 13C:
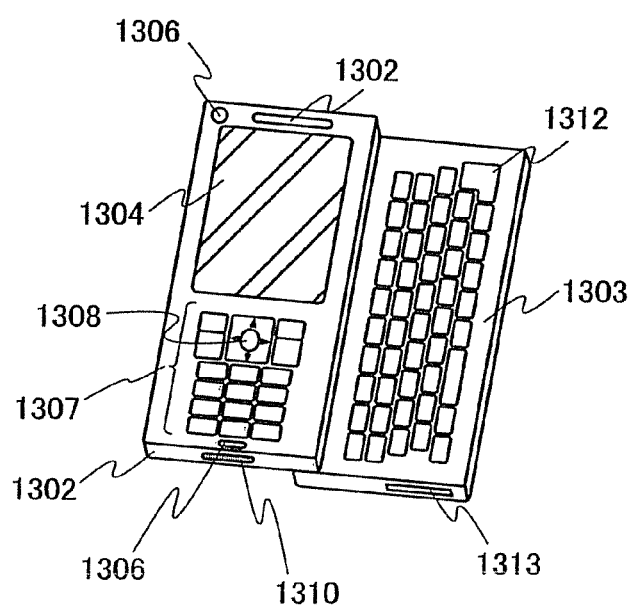

FIGS. 13A to 13C also illustrate a cellular phone. FIG. 13A is a front view, FIG. 13B is a rear view, and FIG. 13C is a development view. A main body 1301 has both functions of a cellular phone and a portable information terminal, and incorporates a computer; thus, the cellular phone is a so-called smartphone which is capable of a variety of data processing in addition to voice calls.

The main body 1301 has two housing: a housing 1302 and a housing 1303. The housing 1302 includes a display portion 1304, a speaker 1305, a microphone 1306, operation keys 1307, a pointing device 1308, a camera lens 1309, an external connection terminal 1310, an earphone terminal 1311, and the like, while the housing 1303 includes a keyboard 1312, an external memory slot 1313, a camera lens 1314, a light 1315, and the like. In addition, an antenna is incorporated in the housing 1302.

In addition to the above-described structure, a wireless IC ship, a small-size memory device, or the like may be incorporated therein.

In the display portion 1304, the light-emitting device described in the above embodiment mode can be incorporated, and a display direction changes as appropriate depending on a use mode. Since the camera lens 1314 is provided in the same plane as the display portion 1304, the mobile phone can be used as a videophone. Further, a still image and a moving image can be taken with the camera lens 1314 and the light 1315 using the display portion 1304 as a viewfinder. The speaker 1305 and the microphone 1306 can be used for video calls, recording and playing sound, and the like without being limited to voice calls.

The operation keys 1307 are capable of being used for incoming and outgoing calls, simple input of information such as e-mail, scroll of a screen, cursor motion, and the like. Furthermore, the housings 1302 and 1303 which overlap with each other (FIG. 13A) slide and can be developed as illustrated in FIG. 13C, so that the cellular phone can be used as a portable information terminal. In this case, smooth operation is possible with use of the keyboard 1312 and the pointing device 1308. The external connection terminal 1310 can be connected to an AC adaptor and various types of cables such as a USB cable, so that charging and data communication with a personal computer or the like are possible. Furthermore, a large amount of data can be stored and moved with a recording medium inserted into the external memory slot 1313.

Moreover, the cellular phone may be equipped with an infrared communication function, a television receiving function, and the like, in addition to the above-described functions.

Note that the above-described cellular phone is manufactured using a light-emitting device, which is formed according to the present invention, in the display portion 1304. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a cellular phone; thus, an inexpensive cellular phone can be provided.

As described above, electronic devices or lighting equipment can be obtained by application of the light-emitting device according to the present invention. The application range of the light-emitting device according to the present invention is so wide that the light-emitting device can be applied to electronic devices in various fields.

Note that a structure described in Embodiment Mode 6 can be combined with a structure in any of Embodiment Modes 1 to 5 as appropriate.

[Embodiment 1]

In this embodiment, measurement results of reflectance of metal nitride which is used for a light-absorbing layer of an evaporation donor substrate of the present invention will be described.

Note that at the time of measurement of reflectance, metal nitride (e.g., titanium nitride, tantalum nitride, or tungsten nitride) formed to a thickness of 200 nm over a glass substrate was used and reflectances with respect to light having wavelengths ranging from 300 nm to 800 nm were measured. The measurement results are shown in FIG. 14.

Figure 14:
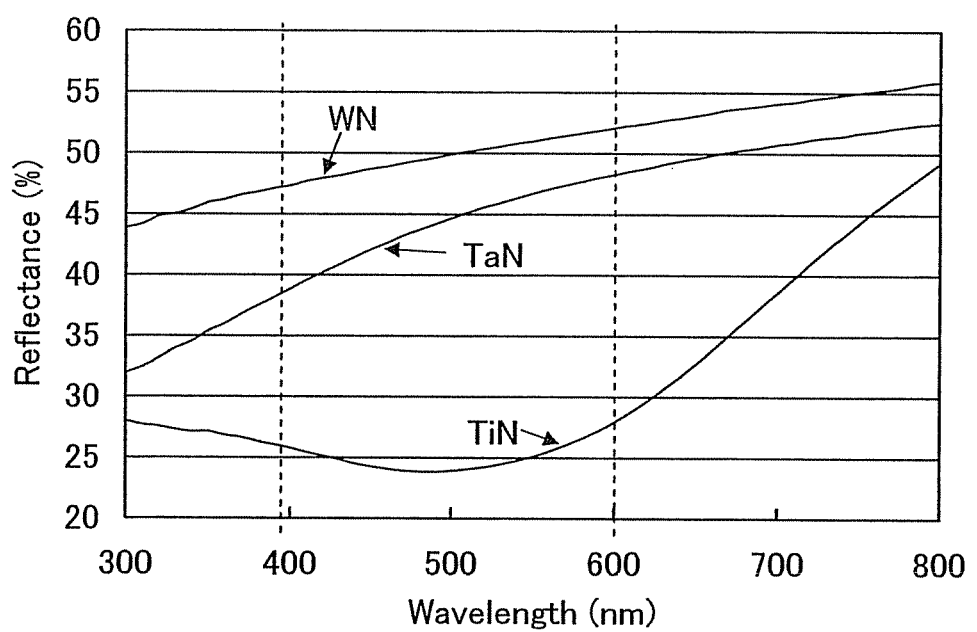
FIG. 14 is a graph illustrating Embodiment 1.

According to FIG. 14, it can be found that the metal nitride had a low reflectance of about less than or equal to 55% with respect to light having wavelengths ranging from 400 nm to 600 nm. Accordingly, when evaporation is performed using light having wavelengths ranging from 400 nm to 600 nm, the light absorptance of a light-absorbing layer in the case where the evaporation donor substrate of the present invention has the light-absorbing layer formed of metal nitride is higher than that in the case where the light-absorbing layer is formed of a substance other than metal nitride; thus, efficiency in evaporation can be increased.

This application is based on Japanese Patent Application serial No. 2007-338575 filed with Japan Patent Office on Dec. 28, 2007 and Japanese Patent Application serial No. 2008-026119 filed with Japan Patent Office on Feb. 6, 2008, the entire contents of which are hereby incorporated by reference.

What is claimed is:

1. A method for manufacturing a light-emitting device, comprising the steps of:
providing a first substrate on which a first function film, a reflective layer having an opening in contact with the first function film, a heat-insulating layer in contact with the reflective layer, a second function film in contact with the first function film and the heat-insulating layer, a light-absorbing layer in contact with the second function film, and a material layer in contact with the light-absorbing layer are formed, and a second substrate so as to face each other and be close to each other; and
evaporating a part of the material layer over the second substrate by heating selectively the material layer at a position overlapping with the opening of the reflective layer by passing laser light having a wavelength of greater than or equal to 400 nm and less than or equal to 600 nm through the first substrate.

2. The method for manufacturing a light-emitting device, according to claim 1, wherein the first function film at the position overlapping with the reflective layer is a reflective film and a stacked film of the first function film and the second function film formed at a position of the opening of the reflective layer is an anti-reflection film.

3. The method for manufacturing a light-emitting device, according to claim 1, wherein a wavelength of the laser light is any one of 488 nm, 514 nm, 527 nm, 532 nm, or 561nm.

4. The method for manufacturing a light-emitting device, according to claim 1, wherein each of the first function film and the second function film is formed using silicon oxide, silicon nitride, silicon oxynitride, or silicon nitride oxide.

5. The method for manufacturing a light-emitting device, according to claim 1, wherein the reflective layer has a reflectance of greater than or equal to 85% with respect to light.

6. The method for manufacturing a light-emitting device, according to claim 1, wherein the reflective layer contains any of aluminum, silver, gold, platinum, copper, an alloy containing aluminum, an alloy containing silver, or indium tin oxide.

7. The method for manufacturing a light-emitting device, according to claim 1, wherein the heat-insulating layer contains any of titanium oxide, silicon oxide, silicon nitride, silicon oxynitride, silicon nitride oxide, or zirconium oxide.

8. The method for manufacturing a light-emitting device, according to claim 1, wherein the light-absorbing layer comprises a metal nitride.

9. The method for manufacturing a light-emitting device, according to claim 8, wherein the metal nitride contains any of titanium nitride, tantalum nitride, tungsten nitride, or molybdenum nitride.

10. The method for manufacturing a light-emitting device, according to claim 1, wherein the material layer comprises an organic compound.

11. The method for manufacturing a light-emitting device, according to claim 1, wherein the material layer contains one or both of a light-emitting material and a carrier-transporting material.

12. A method for manufacturing a light-emitting device, comprising the steps of:
providing a first substrate on which a first function film, a reflective layer having an opening in contact with the first function film, a heat-insulating layer in contact with the reflective layer, a second function film in contact with the first function film and the heat-insulating layer, a light-absorbing layer in contact with the second function film, and a material layer in contact with the light-absorbing layer are formed, and a second substrate on which an electrode and an insulator are formed so as to face each other and be close to each other; and
evaporating a part of the material layer over the electrode of the second substrate by heating selectively the material layer at a position overlapping with the opening of the reflective layer by passing laser light having a wavelength of greater than or equal to 400 nm and less than or equal to 600 nm through the first substrate.

13. The method for manufacturing a light-emitting device, according to claim 12, wherein the first function film at the position overlapping with the reflective layer is a reflective film and a stacked film of the first function film and the second function film formed at a position of the opening of the reflective layer is an anti-reflection film.

14. The method for manufacturing a light-emitting device, according to claim 12, wherein a wavelength of the laser light is any one of 488 nm, 514 nm, 527 nm, 532 nm, or 561mm.

15. The method for manufacturing a light-emitting device, according to claim 12, wherein each of the first function film and the second function film is formed using silicon oxide, silicon nitride, silicon oxynitride, or silicon nitride oxide.

16. The method for manufacturing a light-emitting device, according to claim 12, wherein the reflective layer has a reflectance of greater than or equal to 85% with respect to light.

17. The method for manufacturing a light-emitting device, according to claim 12, wherein the reflective layer contains any of aluminum, silver, gold, platinum, copper, an alloy containing aluminum, an alloy containing silver, or indium tin oxide.

18. The method for manufacturing a light-emitting device, according to claim 12, wherein the heat-insulating layer contains any of titanium oxide, silicon oxide, silicon nitride, silicon oxynitride, silicon nitride oxide, or zirconium oxide.

19. The method for manufacturing a light-emitting device, according to claim 12, wherein the light-absorbing layer comprises a metal nitride.

20. The method for manufacturing a light-emitting device, according to claim 19, wherein the metal nitride contains any of titanium nitride, tantalum nitride, tungsten nitride, or molybdenum nitride.

21. The method for manufacturing a light-emitting device, according to claim 12, wherein the material layer comprises an organic compound.

22. The method for manufacturing a light-emitting device, according to claim 12, wherein the material layer contains one or both of a light-emitting material and a carrier-transporting material.

23. A method for manufacturing a light-emitting device, comprising the steps of:
providing a first substrate on which a first function film, a reflective layer having an opening in contact with the first function film, a heat-insulating layer in contact with the reflective layer, a second function film in contact with the first function film and the heat-insulating layer, a light-absorbing layer in contact with the second function film, and a material layer in contact with the light-absorbing layer are formed, wherein the second function film is in contact with the first substrate through an opening formed in the first function film, and a second substrate so as to face each other and be close to each other; and
evaporating a part of the material layer over the second substrate by heating selectively the material layer at a position overlapping with the opening of the reflective layer by passing laser light having a wavelength of greater than or equal to 400 nm and less than or equal to 600 nm through the first substrate.

24. The method for manufacturing a light-emitting device, according to claim 23, wherein the first function film is a reflective film and the second function film is an anti-reflection film.

25. The method for manufacturing a light-emitting device, according to claim 23, wherein a wavelength of the laser light is any one of 488 nm, 514 nm, 527 nm, 532 nm, or 561 nm.

26. The method for manufacturing a light-emitting device, according to claim 23, wherein each of the first function film and the second function film is formed using silicon oxide, silicon nitride, silicon oxynitride, or silicon nitride oxide.

27. The method for manufacturing a light-emitting device, according to claim 23, wherein the reflective layer has a reflectance of greater than or equal to 85% with respect to light.

28. The method for manufacturing a light-emitting device, according to claim 23, wherein the reflective layer contains any of aluminum, silver, gold, platinum, copper, an alloy containing aluminum, an alloy containing silver, or indium tin oxide.

29. The method for manufacturing a light-emitting device, according to claim 23, wherein the heat-insulating layer contains any of titanium oxide, silicon oxide, silicon nitride, silicon oxynitride, silicon nitride oxide, or zirconium oxide.

30. The method for manufacturing a light-emitting device, according to claim 23, wherein the light-absorbing layer comprises a metal nitride.

31. The method for manufacturing a light-emitting device, according to claim 30, wherein the metal nitride contains any of titanium nitride, tantalum nitride, tungsten nitride, or molybdenum nitride.

32. The method for manufacturing a light-emitting device, according to claim 23, wherein the material layer comprises an organic compound.

33. The method for manufacturing a light-emitting device, according to claim 23, wherein the material layer contains one or both of a light-emitting material and a carrier-transporting material.

* * * * *

UNITED STATES PATENT AND TRADEMARK OFFICE
CERTIFICATE OF CORRECTION

PATENT NO. : 8,435,811 B2
APPLICATION NO. : 13/329624
DATED : May 7, 2013
INVENTOR(S) : Kohei Yokoyama et al.

It is certified that error appears in the above-identified patent and that said Letters Patent is hereby corrected as shown below:

In the Specification:

Column 12, Line 66; Change "are faulted; a" to --are formed; a--.
Column 21, Line 46; Change "difluorophenyppyridinato" to --difluorophenyl)pyridinato--.
Column 21, Line 49; Change "difluorophenyppyridinato" to --difluorophenyl)pyridinato--.
Column 26, Line 1; Change "(Spiro" to --(spiro--.
Column 26, Line 32; Change "$cm^2Ns.$" to --$cm^2/Vs.$--.

Signed and Sealed this
Twentieth Day of August, 2013

Teresa Stanek Rea
*Acting Director of the United States Patent and Trademark Office*